US012598945B2

(12) United States Patent
Iguchi et al.

(10) Patent No.: US 12,598,945 B2
(45) Date of Patent: Apr. 7, 2026

(54) PATH SETTING SYSTEM, PATH SETTING METHOD, AND SOFTWARE

(71) Applicant: TOKYO ELECTRON LIMITED, Tokyo (JP)

(72) Inventors: Yoshinori Iguchi, Yamanashi (JP); Takehiro Shindo, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 289 days.

(21) Appl. No.: 18/301,193

(22) Filed: Apr. 14, 2023

(65) Prior Publication Data

US 2023/0343624 A1 Oct. 26, 2023

(30) Foreign Application Priority Data

Apr. 25, 2022 (JP) ................................. 2022-071779

(51) Int. Cl.
*H01L 21/677* (2006.01)
*H01L 21/67* (2006.01)
(52) U.S. Cl.
CPC .. *H01L 21/67715* (2013.01); *H01L 21/67167* (2013.01); *H01L 21/67709* (2013.01); *H01L 21/67712* (2013.01)
(58) Field of Classification Search
CPC ......... H01L 21/67167; H01L 21/67703; H01L 21/67709; H01L 21/67712; H01L 21/67715; H01L 21/67745
See application file for complete search history.

(56) References Cited

U.S. PATENT DOCUMENTS

| | | | | |
|---|---|---|---|---|
| 7,606,633 B2* | 10/2009 | Hosokawa | ............. | B25J 9/1666 |
| | | | | 901/6 |
| 11,809,158 B2* | 11/2023 | Seo | .................... | G05B 19/4065 |
| 12,211,382 B2* | 1/2025 | Eguchi | .................. | G08G 1/127 |
| 12,211,720 B2* | 1/2025 | Hatano | ............. | H01L 21/67742 |
| 12,288,709 B2* | 4/2025 | Chung | ................ | H01L 21/6776 |
| 2005/0220582 A1* | 10/2005 | Kumagai | .......... | H01L 21/67167 |
| | | | | 414/416.05 |
| 2007/0219660 A1* | 9/2007 | Kaneko | ............. | H01L 21/67271 |
| | | | | 700/121 |
| 2010/0008688 A1* | 1/2010 | Kimura | ............. | H01L 21/67745 |
| | | | | 399/66 |

(Continued)

FOREIGN PATENT DOCUMENTS

| | | |
|---|---|---|
| JP | H06-083445 A | 3/1994 |
| JP | 2004-280213 A | 10/2004 |

(Continued)

*Primary Examiner* — Joseph C Rodriguez
(74) *Attorney, Agent, or Firm* — Fenwick & West LLP

(57) ABSTRACT

A path setting system is used for setting paths of a plurality of transfer bodies in a substrate transfer device, the substrate transfer device including a substrate transfer area and the plurality of transfer bodies, each having a support configured to support a substrate and configured to float and move by a magnetic force from a floor forming the substrate transfer area. The path setting system includes a virtual area setting part configured to set a virtual area corresponding to the substrate transfer area, a path generating part configured to generate, in the virtual area, moving paths of the transfer bodies from a movement start position to a movement end position, and an interference determining part configured to determine interference between the moving paths.

11 Claims, 16 Drawing Sheets

(56)         References Cited

U.S. PATENT DOCUMENTS

| | | | |
|---|---|---|---|
| 2011/0076120 A1* | 3/2011 | Itou ................... | H01L 21/67778 |
| | | | 414/222.13 |
| 2014/0044502 A1* | 2/2014 | Uemura ............ | H01L 21/67745 |
| | | | 414/217 |
| 2016/0218029 A1 | 7/2016 | Janakiraman et al. | |
| 2016/0307784 A1* | 10/2016 | Gomi ................ | H01L 21/67745 |
| 2017/0263483 A1 | 9/2017 | Kuwahara | |
| 2019/0271970 A1* | 9/2019 | Nonobe ............. | G05B 19/4155 |
| 2019/0287831 A1* | 9/2019 | Mizuguchi ........ | H01L 21/67259 |
| 2020/0407179 A1* | 12/2020 | Kim ................... | H01L 21/67196 |
| 2022/0415687 A1 | 12/2022 | Hatano et al. | |
| 2023/0093324 A1* | 3/2023 | Okubo .............. | H01L 21/67745 |
| | | | 700/121 |
| 2023/0384798 A1* | 11/2023 | Harasaki ........... | H01L 21/67727 |
| 2024/0128103 A1* | 4/2024 | Deng ................. | H01L 21/67742 |
| 2024/0213064 A1* | 6/2024 | Nagasawa ......... | H01L 21/67167 |

FOREIGN PATENT DOCUMENTS

| | | |
|---|---|---|
| JP | 2012-148861 A | 8/2012 |
| JP | 2016-063039 A | 4/2016 |
| JP | 2018-504784 A | 2/2018 |
| JP | 2021086987 A | 6/2021 |
| KR | 10-2017-0106464 A | 9/2017 |
| WO | WO 2016/118335 A1 | 7/2016 |

* cited by examiner

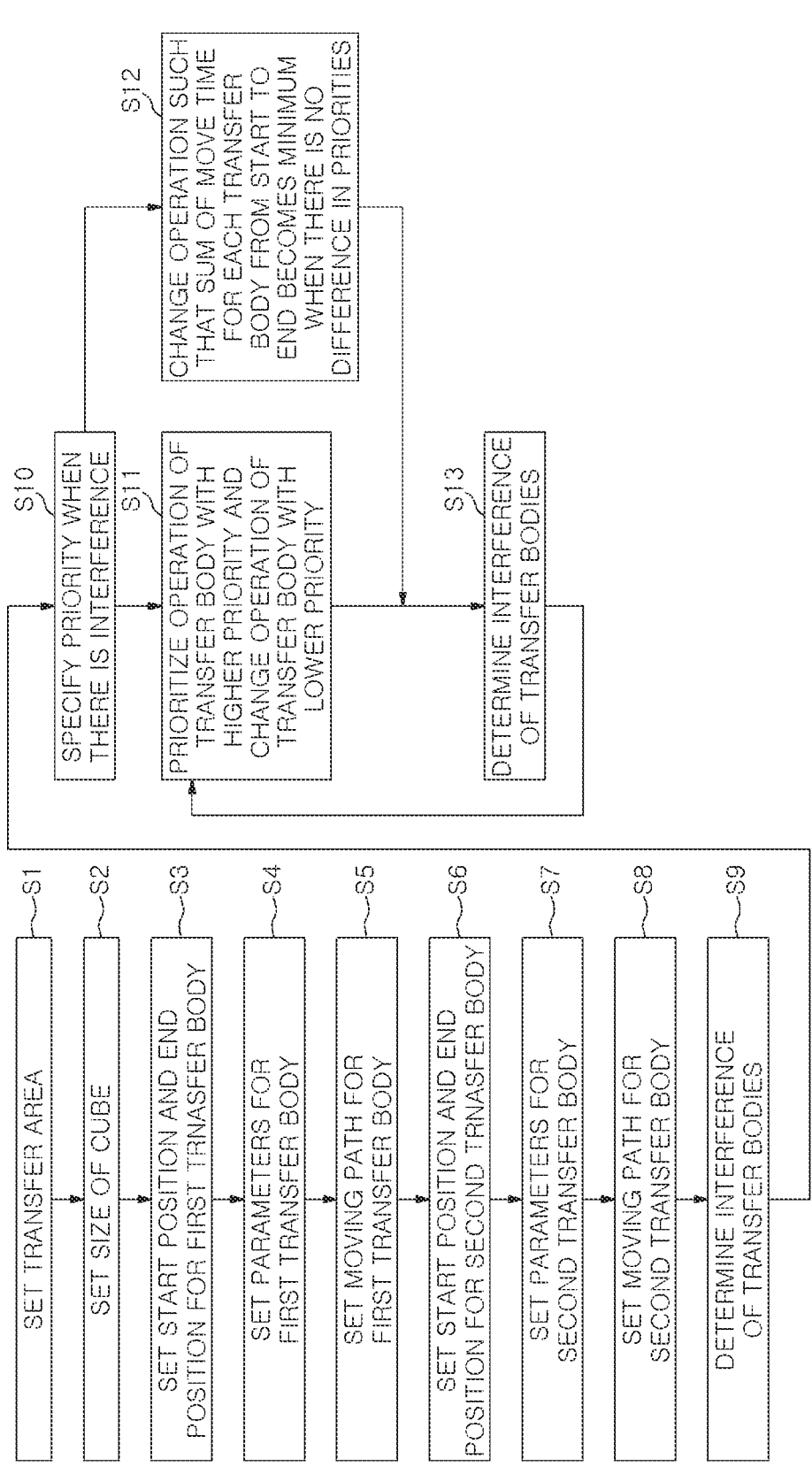

S1 — SET TRANSFER AREA

S2 — SET SIZE OF CUBE

S3 — SET START POSITION AND END POSITION FOR FIRST TRNASFER BODY

S4 — SET PARAMETERS FOR FIRST TRANSFER BODY

S5 — SET MOVING PATH FOR FIRST TRANSFER BODY

S6 — SET START POSITION AND END POSITION FOR SECOND TRNASFER BODY

S7 — SET PARAMETERS FOR SECOND TRANSFER BODY

S8 — SET MOVING PATH FOR SECOND TRANSFER BODY

S9 — DETERMINE INTERFERENCE OF TRANSFER BODIES

S10 — SPECIFY PRIORITY WHEN THERE IS INTERFERENCE

S11 — PRIORITIZE OPERATION OF TRANSFER BODY WITH HIGHER PRIORITY AND CHANGE OPERATION OF TRANSFER BODY WITH LOWER PRIORITY

S12 — CHANGE OPERATION SUCH THAT SUM OF MOVE TIME FOR EACH TRANSFER BODY FROM START TO END BECOMES MINIMUM WHEN THERE IS NO DIFFERENCE IN PRIORITIES

S13 — DETERMINE INTERFERENCE OF TRANSFER BODIES

PATH SETTING SYSTEM, PATH SETTING METHOD, AND SOFTWARE

CROSS-REFERENCE TO RELATED APPLICATIONS

This application claims priority to Japanese Patent Application No. 2022-071779 filed on Apr. 25, 2022, the entire contents of which are incorporated herein by reference.

TECHNICAL FIELD

The present disclosure relates to a path setting system, a path setting method, and a software.

BACKGROUND

In a semiconductor device manufacturing process, a semiconductor wafer (hereinafter, referred to as "wafer") that is a substrate is transferred into an apparatus and processed. Patent Document 1 discloses a substrate processing apparatus having a vacuum transfer module (vacuum transfer chamber). A plurality of transfer bodies (transfer units) that float from a floor by a magnetic force are disposed in the vacuum transfer module to transfer wafers.

PRIOR ART DOCUMENTS

Patent Documents

Patent Document 1: Japanese Laid-open Patent Publication No. 2021-86987

SUMMARY

The present disclosure provides a technique capable of reducing an operator's burden for setting in a path setting system for a transfer body used in a substrate transfer apparatus including a plurality of transfer bodies that move by a magnetic force.

In an exemplary embodiment, a path setting system used for setting paths of a plurality of transfer bodies in a substrate transfer device, the substrate transfer device including a substrate transfer area and the plurality of transfer bodies, each having a support configured to support a substrate and configured to float and move by a magnetic force from a floor forming the substrate transfer area, comprises a virtual area setting part configured to set a virtual area corresponding to the substrate transfer area; a path generating part configured to generate, in the virtual area, moving paths of the transfer bodies from a movement start position to a movement end position; and an interference determining part configured to determine interference between the moving paths.

BRIEF DESCRIPTION OF THE DRAWINGS

The objects and features of the present disclosure will become apparent from the following description of embodiments, given in conjunction with the accompanying drawings, in which:

FIG. 3 is a block diagram showing a configuration of the path setting system;

FIG. 14 is a flowchart showing a setting sequence set by the path setting system;

DETAILED DESCRIPTION

[Description of Substrate Processing Apparatus]

Figure 1:
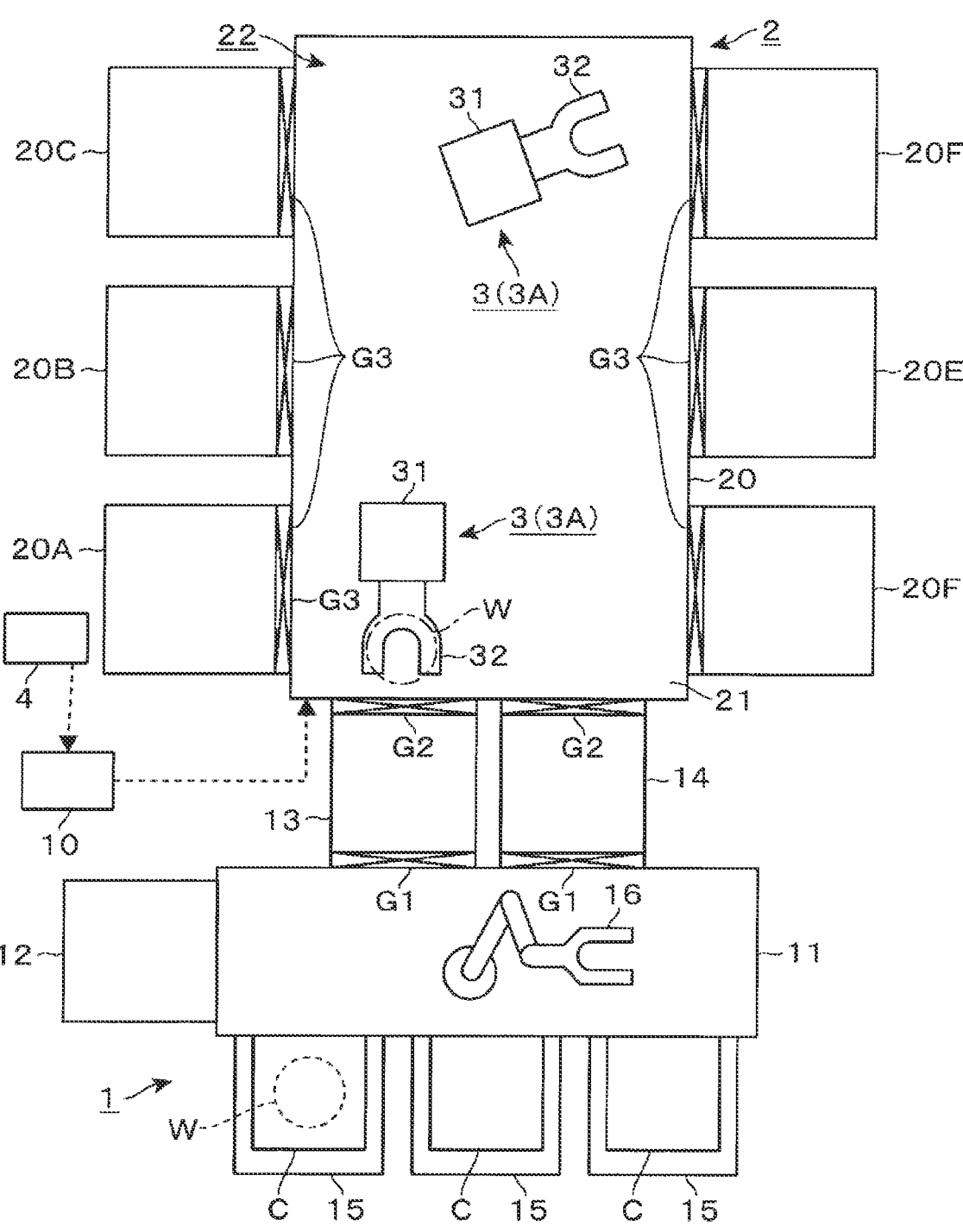
FIG. 1 is a plan view of a substrate processing apparatus including a substrate transfer device to which the setting performed by a path setting system according to one embodiment of the present disclosure is applied.

Before a path setting system 4 that is an embodiment of the present disclosure is described, a substrate processing apparatus 1 that is an example of an apparatus to which the path setting system 4 is applied will be described with reference to the plan view of FIG. 1. The substrate processing apparatus 1 includes a loader module 11, an alignment module 12, load-lock modules 13 and 14, a vacuum transfer module 2, and processing modules 20A to 20F. In each of the processing modules 20A to 20F, a wafer W that is a circular substrate is processed in a vacuum atmosphere.

The loader module 11 is referred to as "Equipment Front End Module (EFEM)" and performs loading/unloading of a wafer W into/from a transfer container C referred to as "Front Opening Unified Pod (FOUP)" accommodating wafers W. A plurality of container placing parts 15 for placing transfer containers C are arranged side by side on the front side of the loader module 11. A transfer mechanism 16 that is a multi-joint arm is disposed in the loader module 11.

The alignment module 12 is connected to the left side of the loader module 11 when viewed from the front side toward the rear side. The alignment module 12 detects the center of the wafer W. The transfer mechanism 16 receives the wafer W from the alignment module 12 based on the detection result, so that the wafer W is placed at an appropriate position at the transfer destination of the wafer W beyond the alignment module 12.

The load-lock modules 13 and 14 are connected to the rear side of the loader module 11. The load-lock modules 13 and 14 are spaced apart from each other in the left-right direction. The inner atmospheres of the load-lock modules 13 and 14 can be switched between a normal pressure atmosphere that is a nitrogen gas atmosphere and a vacuum atmosphere. Door valves G1 are disposed between the load-lock modules 13 and 14 and the loader module 11.

Figure 2:
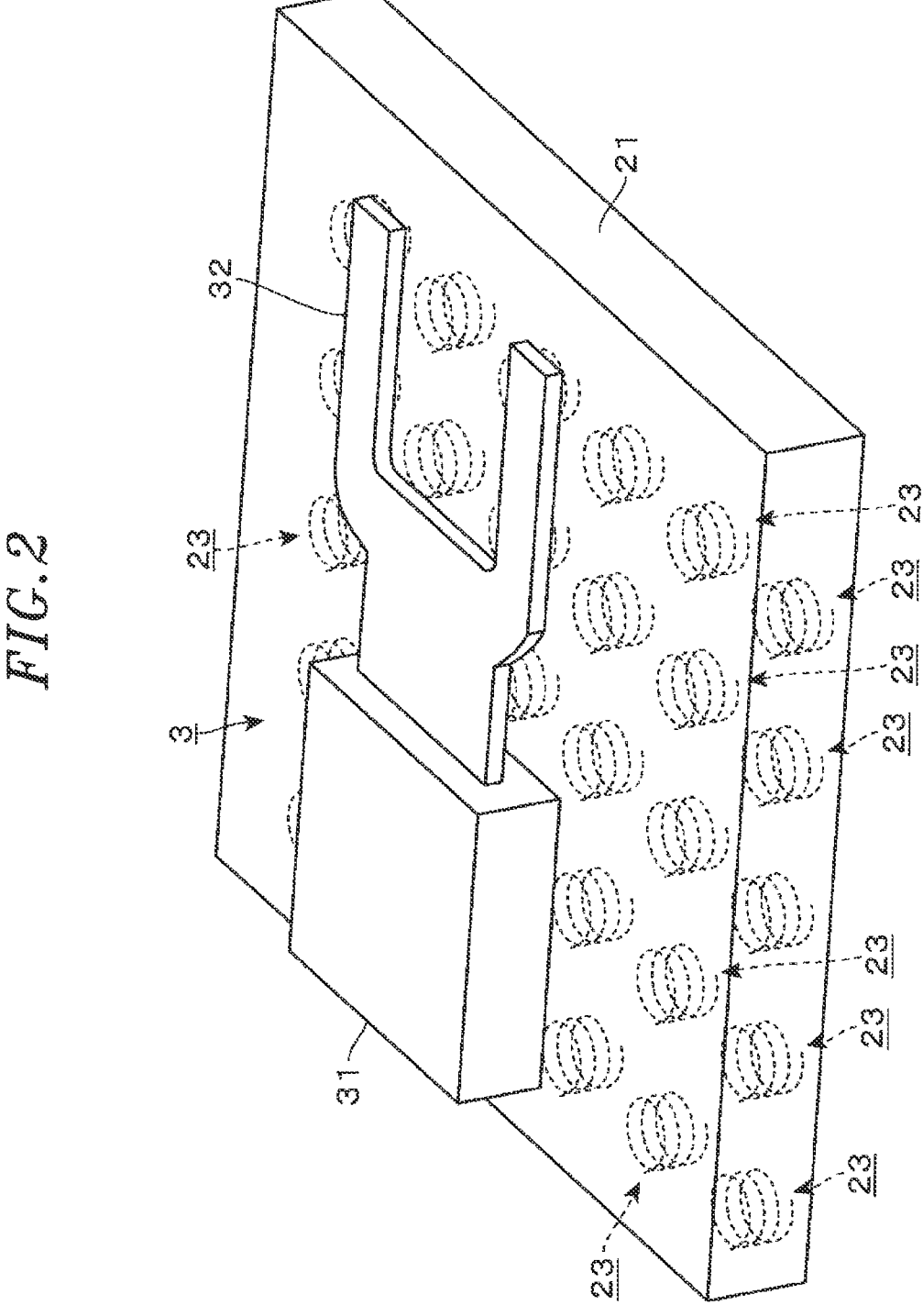
FIG. 2 is a perspective view of a transfer body and a floor of a substrate transfer device.

The vacuum transfer module 2 is connected to the rear side of the load-lock modules 13 and 14 via gate valves G2. The vacuum transfer module 2 is a substrate transfer device, and has a rectangular housing 20. A space above a floor 21 in the housing 20 serves as a rectangular parallelepiped substrate transfer area 22. Therefore, the floor 21 forms the bottom portion of the substrate transfer area 22. As shown in the schematic perspective view of FIG. 2, a plurality of coils 23 are horizontally distributed and embedded in the floor 21. A power is individually supplied to the coils 23, and the coils 23 generate a magnetic field with an intensity corresponding to the supplied power. In other words, the coils 23 serves as electromagnets.

A plurality of transfer bodies 3 for supporting and transferring wafers W are disposed in the substrate transfer area 22, and operate in the substrate transfer area 22. The transfer bodies 3 float and move from the floor 21 by the magnetic field on the floor 21. Accordingly, high cleanliness is ensured in the substrate transfer area 22. The operations of the transfer bodies 3 are controlled independently. In this example, two transfer bodies 3A and 3B are provided as the transfer bodies 3 to be distinguished from each other.

Hereinafter, the transfer body 3 will be described in detail. The transfer body 3 includes a moving body 31 having therein a permanent magnet, and a support 32 for supporting the wafer W from the bottom side. In this example, the support 32 is connected to the lateral side of the moving body 31, and the moving body 31 located on the floor 21 can enter the load-lock modules 13 and 14 and the processing modules 20A to 20F to deliver the wafer W to the modules. The energized coils 23 and the magnet of the moving body 31 repel due to the magnetic force, so that the transfer body 3A floats from the floor 21. By controlling the magnetic field on the floor 21 by switching the coils 23 to which the power is supplied or by adjusting the power supply amount, it is possible to move the transfer body 3 that is floating in any direction, change the direction, stop movement thereof, and change inclination thereof. The movement in any direction includes vertical movement as well as horizontal movement.

The processing modules 20A to 20F are connected to different positions of the vacuum transfer module 2 through gate valves G3. Each of the processing modules 20A to 20F includes a processing chamber maintained at a vacuum atmosphere, a stage configured to place the wafer W thereon in the processing chamber and control a temperature of the wafer W, and a gas supply part for supplying a processing gas to the wafer W to perform processing. The stage is provided with lift pins for transferring the wafer W with respect to the transfer bodies 3A and 3B. In the processing modules 20A to 20F, the wafer W is processed by the processing gas. The processing may be etching, film formation, annealing, or the like. Further, a plasma producing mechanism may be provided so that plasma is produced from the processing gas and used for processing.

Similarly to the processing modules 20A to 20F, in each of the load-lock modules 13 and 14, a stage provided with lift pins is disposed and, thus, the wafer W can be transferred between the transfer mechanism 16, the transfer bodies 3, and the stage. According to a transferring path of the wafer W in the substrate processing apparatus 1, the wafer W transferred from the transfer container C into the loader module 11 is transferred in the order of the alignment module 12, then the loader module 11, then the load-lock module 13, and then the vacuum transfer module 2. Then, the wafer W is processed in the processing modules 20A to 20F, and transferred in the order of the vacuum transfer module 2, then the load-lock module 14, then the loader module 11, and then the transfer container C. The door valve G1 and the gate valves G2 and G3 are closed except when the wafer W is transferred between the modules, thereby separating the atmosphere between the modules.

When the wafer W is transferred between the vacuum transfer module 2 and the processing modules 20A to 20F, the wafer W may be transferred to only one of the six processing modules 20A to 20F and processed, or may be sequentially transferred to the six processing modules 20A to 20F and processed. The wafer W may be transferred between the vacuum transfer module 2, the processing modules 20A to 20F, and the load-lock modules 13 and 14 using any one of the transfer bodies 3A and 3B depending on the setting using simulation to be described later.

Further, the substrate processing apparatus 1 includes a controller 10. The controller 10 is configured as a computer. Therefore, the controller 10 includes a program, a memory, a CPU, and the like. The program of the controller 10 includes a set of steps for outputting control signals to individual components of the substrate processing apparatus 1 and controlling the operations of the individual components so that the wafer W can be transferred and processed as described above. The program is stored in the controller 10 while being stored in a storage medium such as a hard disk, a compact disc, a DVD, a memory card, or the like.
[Background of Path Setting for Transfer Body]

As described above, the plurality of transfer bodies 3 are provided in the vacuum transfer module 2. The transfer bodies 3 are not necessarily two transfer bodies 3A and 3B, and a larger number of transfer bodies may be provided. The plurality of transfer bodies 3 can move independently as described above. Since they can move both horizontally and vertically, they have a high degree of freedom of movement.

In the case of setting the moving paths of the transfer bodies 3 between the modules before the operation of the substrate processing system 1, it is required to set the moving paths of the transfer bodies 3 such that the wafer W can be quickly transferred between the modules while preventing interference between the transfer bodies 3. Since, however, the transfer bodies 3 can move independently and have a high degree of freedom of movement as described above, an operator may experience an increased effort or burden when setting the moving paths of the transfer bodies.

During the operation of the substrate processing system 1, the transfer bodies 3 may move along the moving paths that have not been set in advance to transfer the wafer W from an arbitrary position to an arbitrary module. Even in that case, it is required that the transfer bodies 3 move along the moving paths where the wafer W can be quickly transferred without interference between the transfer bodies 3. The present disclosure can meet such requirements.
[Outline of Path Setting System 4]

Figure 3:
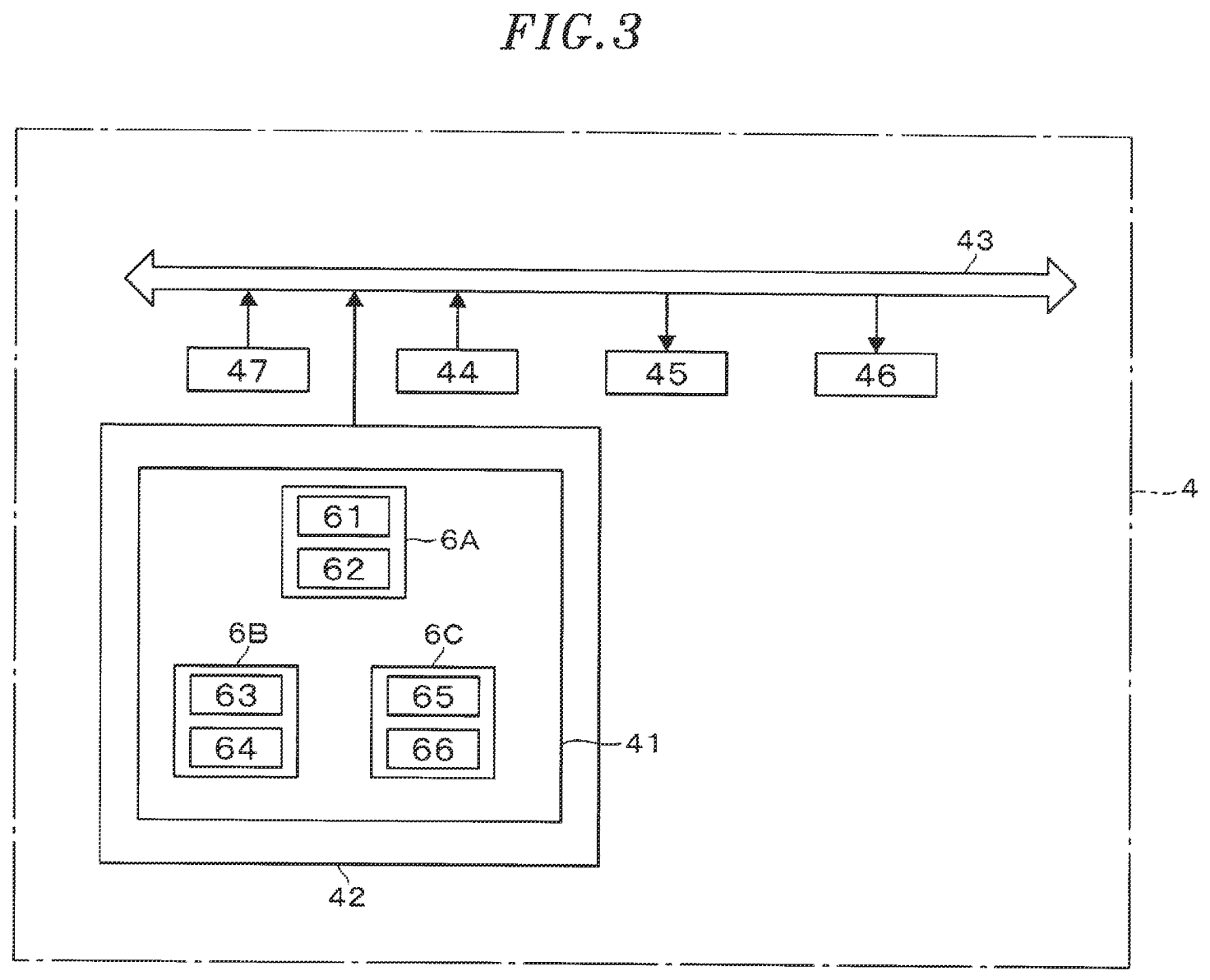

FIG. 3 shows a block diagram of the path setting system 4 that is an embodiment of the present disclosure. The path setting system 4 is a computer. Briefly, the path setting system 4 performs simulation for generating the moving paths of the transfer bodies 3A and 3B based on parameters inputted by an operator, and determines whether or not the transfer bodies 3A and 3B interfere with each other on the moving paths. When it is determined that there is interference, the simulation for changing the operation setting of the transfer body 3A and/or the transfer body 3B is performed to avoid the interference between the transfer bodies 3A and 3B while preventing an excessive increase in a moving time required for the transfer bodies 3A and 3B to move from the movement start positions to the movement end positions.

In this example, the operation setting is changed by changing the moving path or decelerating the transfer body 3 on the moving path. In the case of changing the moving path to prevent an excessive increase in the moving time, an appropriate path is selected among a plurality of paths. In the case of changing the speed, the speed is appropriately decelerated.

The data obtained by the simulation and the data inputted by an operator to execute the simulation are stored and used to control the operations of the transfer bodies 3A and 3B under the control of the controller 10. The transfer bodies 3 operate at the moving speeds on the moving paths that are determined by the simulation.

[Configuration of Path Setting System 4]

In this example, the path setting system 4 is described as a computer separate from the controller 10 of the substrate processing apparatus 1. Further, the path setting system 4 sets the moving paths of the transfer bodies 3 before the operation of the substrate processing apparatus 1. As described above, three or more transfer bodies may be provided. However, in the following description, the two transfer bodies 3A and 3B are provided as described with reference to FIG. 1, and the moving paths of the transfer bodies 3A and 3B are generated.

The path setting system 4 has software 41 for performing the above-described processing. The software 41 includes various programs to be described later, and is stored in the storage medium 42 and installed in the path setting system 4. The storage medium 42 is, for example, a hard disk or the like that stores the program of the controller 10. Reference numeral 43 in the drawing denotes a bus connected to the storage medium 42 as well as an input part 44, an output part 45, a memory 46, and a CPU 47.

The input part 44 is used to input various parameters required for setting the moving path, and includes, for example, a mouse, a keyboard, a touch panel, or the like. The output part 45 has, for example, a display. A virtual area to be described later, various cubes forming the virtual area, a window that allows an operator to input and set various parameters, and the like are displayed on the display.

[Processing Performed by Path Setting System 4]

Hereinafter, the simulation performed by the path setting system 4 will be described in detail with reference to FIGS. 4 to 13 schematically showing a part of the virtual area or the entire virtual area in the simulation. The moving path generated by the path setting system 4 is shown from FIG. 7 and subsequent drawings. This moving path is directed from the position where the transfer body 3 delivers the wafer W to any one module to the position where the transfer body 3 delivers the wafer W to another module. For convenience of illustration, the moving paths in FIG. 7 and subsequent drawings are deviated from the moving path that is expected to be generated by the module arrangement of FIG. 1.

Figure 4:
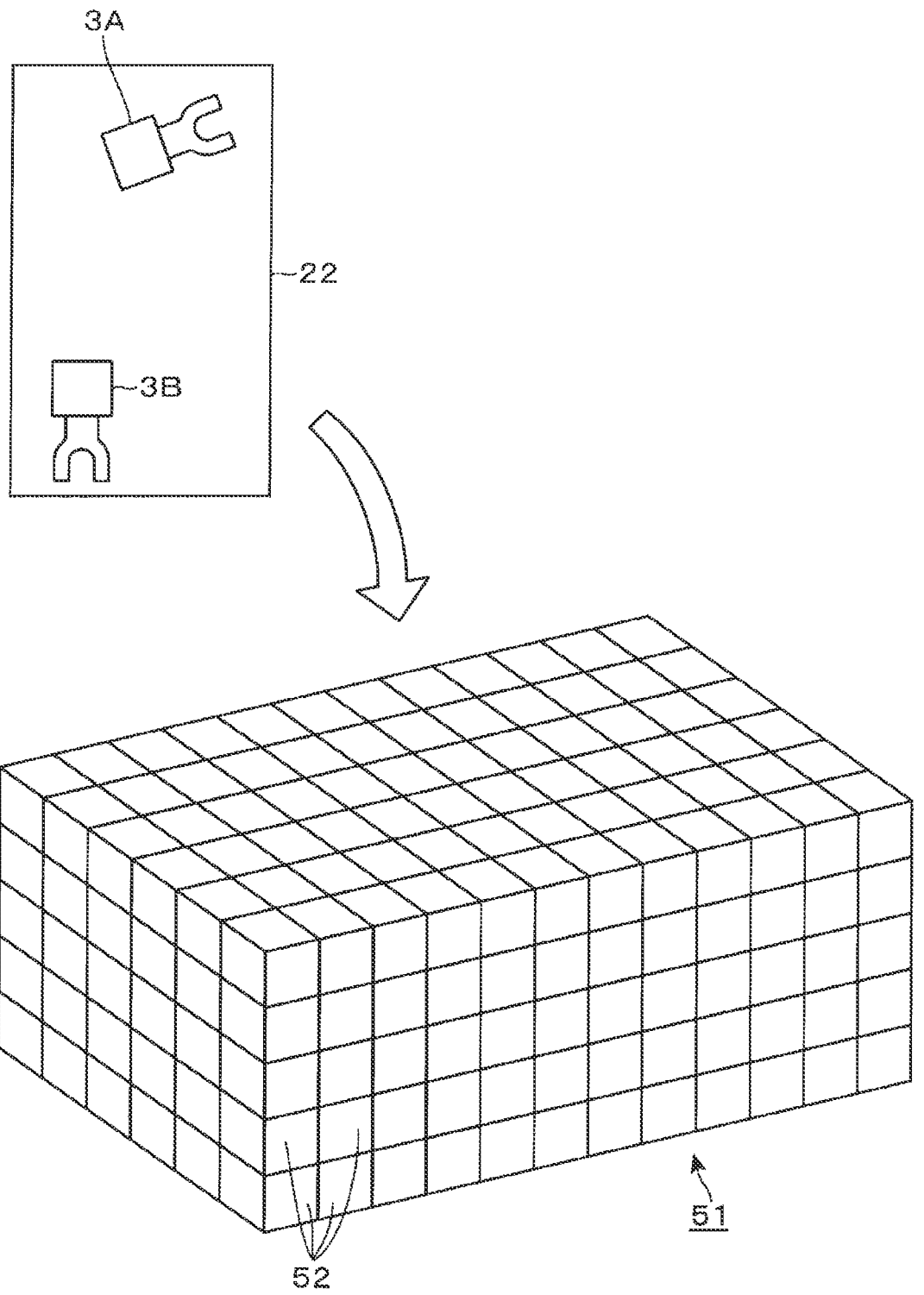
FIG. 4 is a perspective view showing a virtual substrate transfer area set by the path setting system.

A substrate transfer area 51 that is a virtual area is set by an operator's input of parameters such as a dimension, a shape, and the like, as shown in FIG. 4. The substrate transfer area 51 corresponds to the substrate transfer area 22 of the vacuum transfer module 2. Therefore, in this example, the substrate transfer area 51 is set as a rectangular parallelepiped area, similarly to the substrate transfer area 22.

Figure 5:
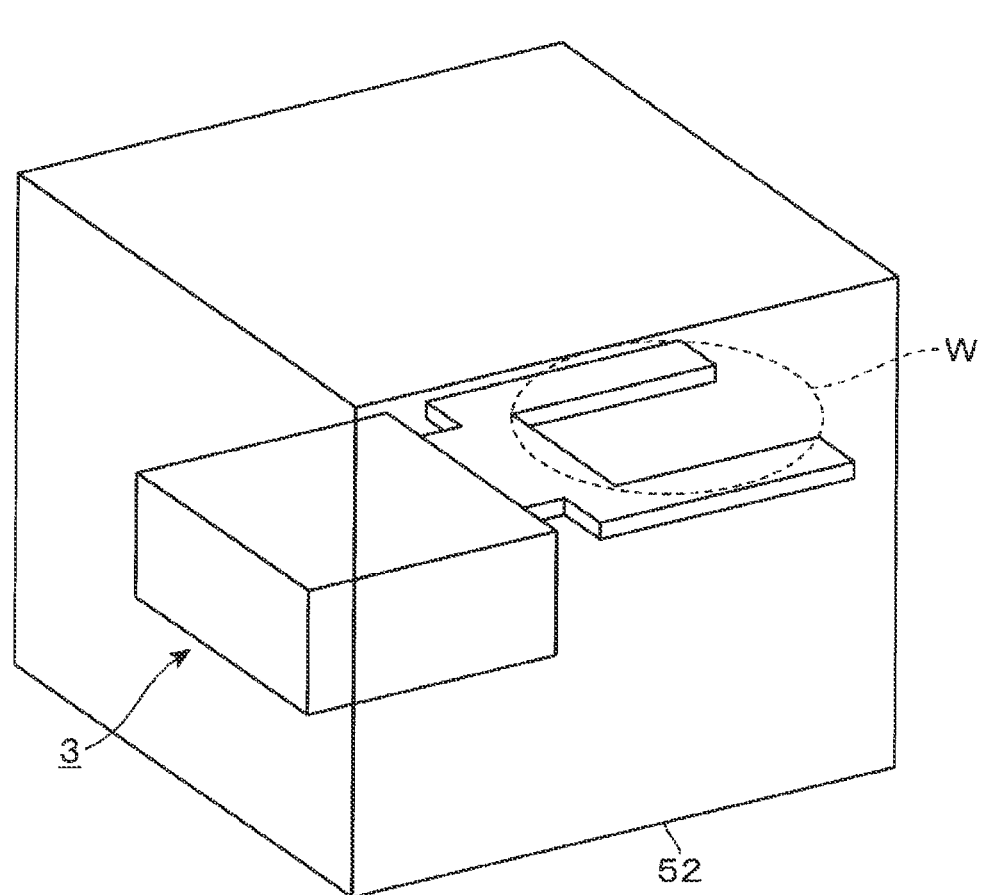
FIG. 5 is a perspective view showing an example of correspondence between a cube forming the virtual substrate transfer area and the transfer body.
Figure 6:
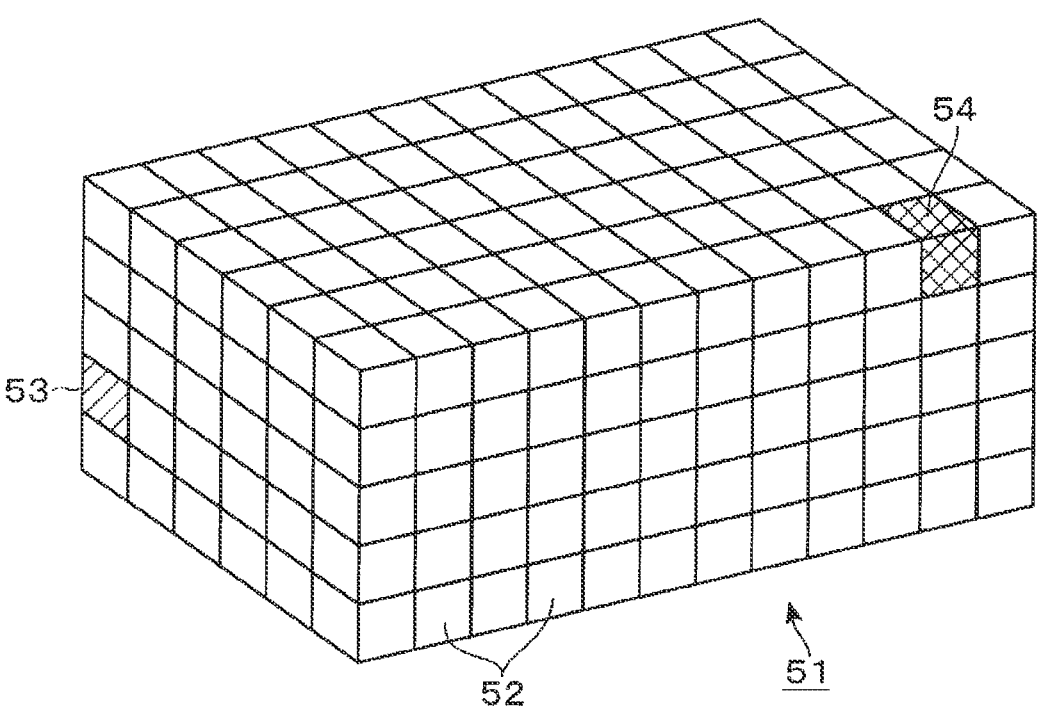
FIG. 6 is a perspective view showing a movement start cube and a movement end cube that are set in the substrate transfer area.

The substrate transfer area 51 is divided in the forward-backward direction, the left-right direction, and the vertical direction, and is considered as an aggregate of rectangular parallelepiped parts, more specifically, cubes 52. In other words, the substrate transfer area 51 is formed by arranging the plurality of cubes 52 adjacent to each other in the horizontal direction (the forward-backward direction and the left-right direction) and the vertical direction. The cube 52 has a size that allows the transfer body 3 supporting the wafer W to be included as shown in FIG. 5.

In order to generate one moving path, an operator specifies any one cube 52 as a movement start cube 53 and another cube 52 as a movement end cube 54 in the substrate transfer area 51. The movement start cube 53 and the movement end cube 54 correspond to the movement start position and the movement end position connected to the moving path, respectively. They are indicated by oblique lines and meshes in FIG. 6 and subsequent drawings to be distinguished from other cubes 52. Further, since any cubes in the substrate transfer area 51 are specified as the movement start cube 53 and the movement end cube 54, the movement start position and the movement end position are set at any positions in the horizontal direction and the vertical direction in the substrate transfer area 51.

Figure 7:
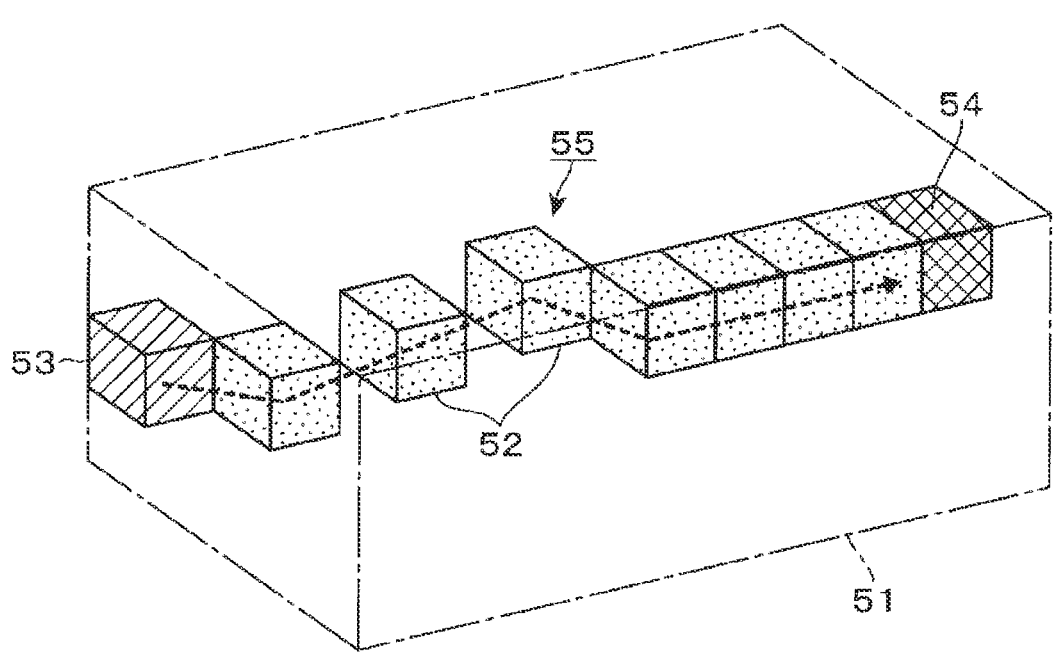
FIG. 7 is a perspective view schematically showing a moving path of a transfer body 3 that is set between the movement start cube and the movement end cube.

When the movement start cube 53 and the movement end cube 54 are specified as described above, the moving path 55 from the movement start cube 53 to the movement end cube 54 is automatically generated by the path setting system 4. As shown in FIG. 7, the moving path 55 is the column of the cubes 52 in which the distance between the movement start cube 53 and the movement end cube 54 becomes minimum. Therefore, the cubes 52 forming the moving path 55 are connected to other cubes 52 forming the moving path 55, the movement start cube 53, or the movement end cube 54 at the surfaces or corners thereof. In the drawings, the cubes 52 forming the moving path 55 are indicated by multiple dots. For convenience of description, the size of one cube 52 corresponds to the size of the transfer body 3 as described above. Therefore, although it is illustrated that each of the movement start cube 53, each of the movement end cube 54, and an interference cube 56 to be described later is formed of one cube 52, the present disclosure is not limited thereto as will be described later.

Although the generation of the moving path 55 of the transfer body 3A has been described, the moving path 55 of the transfer body 3B is generated in the same manner by specifying the movement start cube 53 and the movement end cube 54. Hereinafter, the movement start cube 53, the movement end cube 54, and the moving path 55 for the transfer body 3A may be attached with "A" after reference numerals, and those for the transfer body 3B may be attached with "B" after reference numerals. Specifically, the moving paths of the transfer bodies 3A and 3B may be referred to as "the moving paths 55A and 55B," respectively, for example. When both of the moving paths 55A and 55B are illustrated in the drawings, they are distinguished from each other by increasing the density of dots for the moving path 55B.

[Description of Parameters for Checking Interference Between Transfer Bodies 3]

In order to generate the moving paths 55A and 55B as described above, various parameters are inputted by an operator in addition to the process of specifying the movement start cube 53 and the movement end cube 54. The parameters include speed parameters for calculating the position of the cube 52 on the moving path 55 where the transfer body 3 reaches after a few seconds from the start of movement from the movement start cube 53 and a time period required for the transfer body 3 to reach the movement end cube 54. In other words, in the path setting system 4, the speed parameters can be used for calculating the timing at which the transfer body 3 reaches the movement end cube 54 of the cubes 52 forming the moving path 55 after the start of movement.

The speed parameters include, for example, the maximum speed of the transfer body 3 and the time period required for the transfer body 3 to reach the maximum speed from the start of movement. Theses parameters are set for each transfer body 3. The maximum speed and the time period required to reach the maximum speed indicate the maximum speed and the time period required to reach the maximum speed in the case where the moving path 55 is linear. By specifying the maximum speed and the time period required to reach the maximum speed, a positive acceleration rate from the start of movement from the movement start cube 53 to reach the maximum speed is specified. For example, the transfer body 3 decelerates near the movement end cube 54 at a negative acceleration rate having the same value as that of the positive acceleration rate. Therefore, in this example, the negative acceleration rate (deceleration rate) is specified by specifying the maximum speed and the time period required to reach the maximum speed.

The movement of the transfer body 3 will be further described. If the moving path 55 has a bent portion, for example, the transfer body 3 moves at the bent portion at a speed that is a predetermined ratio of the maximum speed. In other words, the transfer body 3 moves at the bent portion at a speed that is reduced from the maximum speed based on a predetermined rule. More specifically, the transfer body 3 decelerates at a deceleration rate to reach the above-described speed at the bent portion. In other words, when the transfer body 3 moving at the maximum speed reaches the previous cube 52 of the cube 52 forming the bent portion, the transfer body 3 starts decelerating and moves at a speed that is a predetermined ratio of the maximum speed at the bent portion. After the transfer body 3 passes through the bent portion, the transfer body 3 accelerates at the positive acceleration rate and returns to the maximum speed. The transfer body 3 moves at the linear portion and the bent portion of the moving path 55 based on the predetermined rule (moving rule). Therefore, in the path setting system 4, the moving rule and the speed parameters may be used for calculating the timing at which the transfer body 3 reaches each cube 52 forming the moving path 55 after the movement start and the timing at which the transfer body 3 reaches the movement end cube 54.

The parameters inputted by an operator include a time period from an arbitrary reference timing to the start of movement of the transfer bodies 3A and 3B from the movement start cube 53. This parameter corresponds to a difference in timings of starting movement from the movement start cube 53 between the transfer body 3A and the transfer body 3B.

Further, the parameters inputted by an operator include information (referred to as "wafer support information") on whether or not the wafer W is supported by the transfer body 3 on the generated moving path 55. Although the case where the maximum speed of the transfer body 3 on the moving path 55 and the time period required to reach the maximum speed have been described as the speed parameters, the maximum speed and the time period required to reach the maximum speed, which are set by an operator, indicate the maximum speed and the time period required to reach the maximum speed in the case where the wafer W is not supported. In the case of the moving path 55 where it is considered that the wafer W is supported by the transfer body 3 based on the wafer support information, the speed and the time period that are reduced from the maximum speed and the time period required to reach the maximum speed set by an operator based on the predetermined rule are considered as the actual maximum speed and the actual time period required to reach the maximum speed, respectively, for example.

For convenience of description, the maximum speed of the transfer body 3 and the time period required to reach the maximum speed in the case where the wafer W is supported may be described as the maximum speed during the support and the time period required to reach the maximum speed during the support. Meanwhile, the maximum speed of the transfer body 3 and the time period required to reach the maximum speed in the case where the wafer W is not supported may be described as the maximum speed before the support and the time period required to reach the maximum speed before the support so as to be distinguished from the maximum speed during the support and the time period required to reach the maximum speed during the support. In other words, in calculating the timing at which the transfer body 3 reaches the cube 52 and the movement end cube 54 using the moving rules, the maximum speed before the support and the time period required to reach the maximum speed before the support are used when the wafer W is not supported by the transfer body 3, and the maximum speed during the support and the time period required to reach the maximum speed during the support are used when the wafer W is supported by the transfer body 3.

For example, the speed that is a predetermined ratio of the maximum speed before the support, which is set by an operator, is considered as the maximum speed during the support. In other words, if the ratio is 0.8, the value obtained by multiplying the maximum speed before the support by 0.8 is considered as the maximum speed during the support. For example, similarly, the time period that is a predetermined ratio of the time period required to reach the maximum speed before the support, which is set by an operator, is considered as the time period required to reach the maximum speed during the support. As described above, the speed of the transfer body 3 in the case where the wafer W is supported is reduced compared to the speed of the transfer body 3 in the case where the wafer W is not supported based on the wafer support information, and the wafer W is prevented from falling during the movement of the transfer body 3.

Based on the above-described various parameters related to the movement of the transfer body 3, the path setting system 4 can acquire the time information of the position of the transfer body 3 at an arbitrary reference timing for the movement start cube 53, the cubes 52 forming the moving path 55, and the movement end cube 54. More specifically, the information on the cube 52 on the moving path 55 where the transfer body 3 is located after a certain period of time elapses from the reference timing, or the information on a period of time for the transfer body 3 to locate the movement start cube 53 from the reference timing and a period of time for the transfer body 3 to locate the movement end cube 54 from the reference timing can be acquired as the time information of the position of the transfer body 3. In other words, the correspondence between the elapsed time from the arbitrary reference timing and the cube 52 (including the movement start cube 53 and the movement end cube 54) where the transfer body 3 is located in the substrate transfer area 51 can be obtained.

Figure 8:
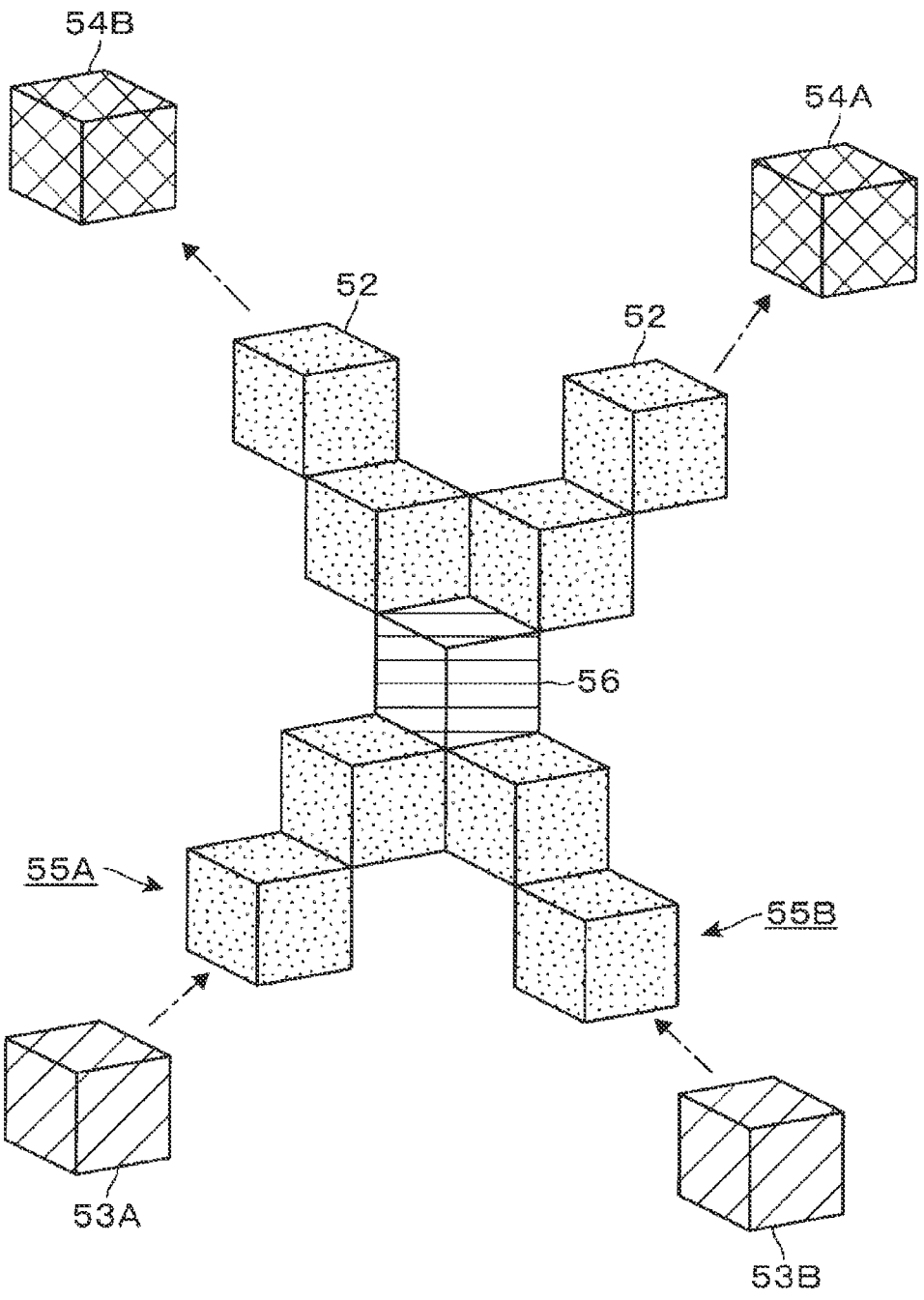
FIG. 8 is a perspective view showing an interference cube in which interference between transfer bodies occurs.

By acquiring the time information of the position for each of the transfer bodies 3A and 3B, it is determined whether or not interference occurs between the transfer bodies 3A and 3B in any one cube 52 on the moving path 55. More specifically, it is determined whether or not one of the transfer bodies 3A and 3B is located at the cube 52 during a period in which the other one of the transfer bodies 3A and 3B is located at the cube 52. In other words, the cube 52 where the occurrence of interference between the transfer bodies 3A and 3B is expected is detected. Hereinafter, the cube 52 where the occurrence of interference is expected is illustrated as the interference cube 56 that is an interference rectangular parallelepiped with horizontal stripes as shown in FIG. 8. Although it is illustrated in the drawings that there is one interference cube 56 indicating an interference occurrence position, a plurality of cubes 52 may serve as the interference cubes 56 depending on the moving path 55 to be generated.

As described above, the substrate transfer area 51 formed of the cubes 52 is displayed on the screen on the output part 45, and the movement start cube 53, the movement end cube 54, the moving path 55, and the interference cube 56 in the substrate transfer area 51 are also displayed on the screen. Further, the movement start cube 53, the movement end cube 54, the cubes 52 forming the moving path 55, the interference cube 56, and the other cubes 52 can be displayed in different colors, for example, on the screen of the output part 45 so that an operator can distinguish them. Therefore, the operator can expect the occurrence of interference between the transfer body 3A and the transfer body 3B from the interference cube 56. The display of the interference cube 56 is canceled when the interference is avoided in the following manners.

[Avoiding Interference Between Transfer Bodies]

It is determined whether or not the interference cube 56 exists on the generated moving path 55. If it is determined that there is no interference cube 56, it is determined that each transfer body 3 moves on the moving path 55 obtained at the time of determination at a speed obtained at the time of determination at each part of the moving path 55. On the other hand, when the interference cube 56 occurs, the path setting system 4 performs simulation of changing the operation setting (the moving path 55 or the speed) of the transfer body 3A and/or the transfer body 3B to avoid the interference between the transfer body 3A and the transfer body 3B.

The operation setting is changed based on the priority, which is a parameter set by an operator, indicating the priority of movement between the transfer body 3A and the transfer body 3B on the moving paths 55A and 55B where the interference occurs. If the transfer bodies 3A and 3B have different priorities, the operation setting of the transfer body 3 with the higher priority is not changed, and the operation setting of the transfer body 3 with the lower priority is changed. If the transfer bodies 3A and 3B have the same priority, the operation settings of both transfer bodies 3A and 3B are changed.

[Countermeasure by Changing Moving Path]

Specifically, the operation setting is changed by changing the moving path 55 of the transfer body 3 to avoid the interference cube 56, or by performing deceleration on the moving path 55 of the transfer body 3 to shift the timing at which the transfer body 3 is located at the interference cube 56. Although one of them is appropriately selected as described above, the case of changing the moving path 55 will be described first. As described above, the moving path

55 is represented by a column of the cubes 52, and the changed moving path 55 is also represented by a column of the cubes 52.

First, the case where the transfer bodies 3A and 3B have different movement priorities will be described. In this case, as described above, the moving path 55 of the transfer body with the lower priority between the transfer body 3A and the transfer body 3B is changed. The moving path 55 is changed such that the transfer body 3 passes through the cube 52 adjacent to the interference cube 56 to bypass the corresponding interference cube 56 and the moving time of the transfer body 3 from the movement start cube 53 to the movement end cube 54 becomes shorter.

Figure 9:
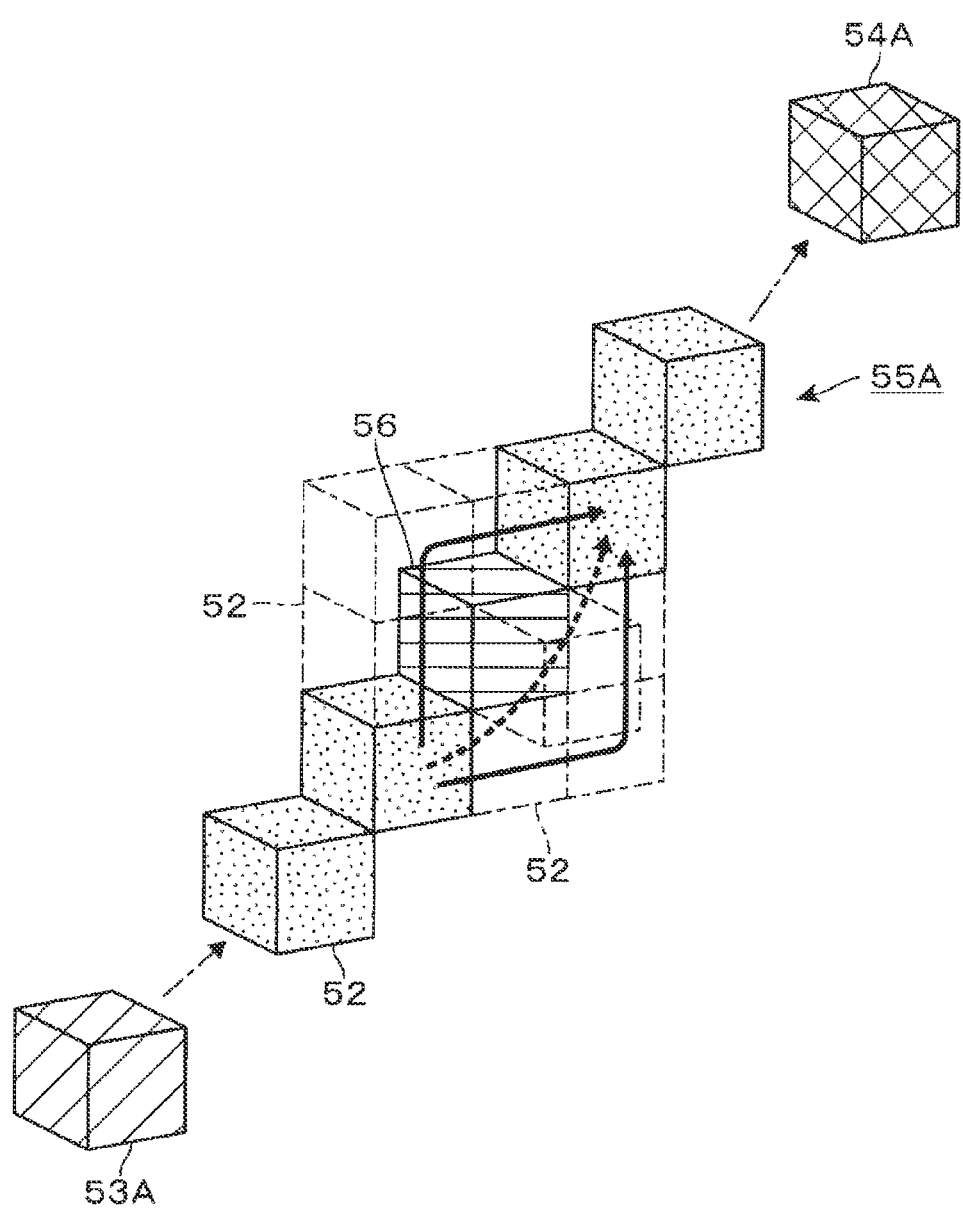
FIG. 9 is a perspective view of cubes showing an example of interference avoidance in the case where there is a difference in priorities between the transfer bodies.

FIG. 9 schematically shows the change in the moving path 55A due to the lower priority of the transfer body 3A, and the cubes 52 forming the moving path 55 before change are indicated by dots as in FIG. 8. There are three candidates for the changed moving path 55A, the portions of the moving path candidates that are changed from the moving path 55 before change are indicated by dashed or solid arrows. More specifically, the changed moving path 55A that bypasses the interference cube 56 may include three paths having a path passing through the cube 52 adjacent to the upper side of the interference cube 56, and a path moving through the cube 52 adjacent to the lateral side of the interference cube 56, and a path moving the cube 52 adjacent to the lower side of the interference cube 56.

The path setting system 4 calculates the moving time required for the transfer body 3A to move from the movement start cube 53A to the movement end cube 54B for each of the candidates for the changed moving path 55A, and compares the moving times. As a result of the comparison, the candidate having the shortest moving time is determined as the changed moving path 55A. For example, when the candidate (indicated by the dashed arrow) passing through the side portion of the interference cube 56 has the shortest moving time of the transfer body 3A from the movement start cube 53A to the movement end cube 54B among the candidates for the changed moving path 55A shown in FIG. 9, the corresponding candidate is determined as the changed moving path 55A.

Next, the case where the transfer bodies 3A and 3B have the same priority will be described. In this case, both moving paths 55A and 55B are changed, for example. More specifically, the moving paths 55 are changed to bypass the interference cube 56 while passing through the cubes 52 adjacent to the interference cube 56. Further, the moving paths 55 are changed such that the sum of the moving time required for the transfer body 3A to move from the movement start cube 53A to the movement end cube 54A and the moving time required for the transfer body 3B to move from the movement start cube 53B to the movement end cube 54B becomes minimum.

Figure 10:
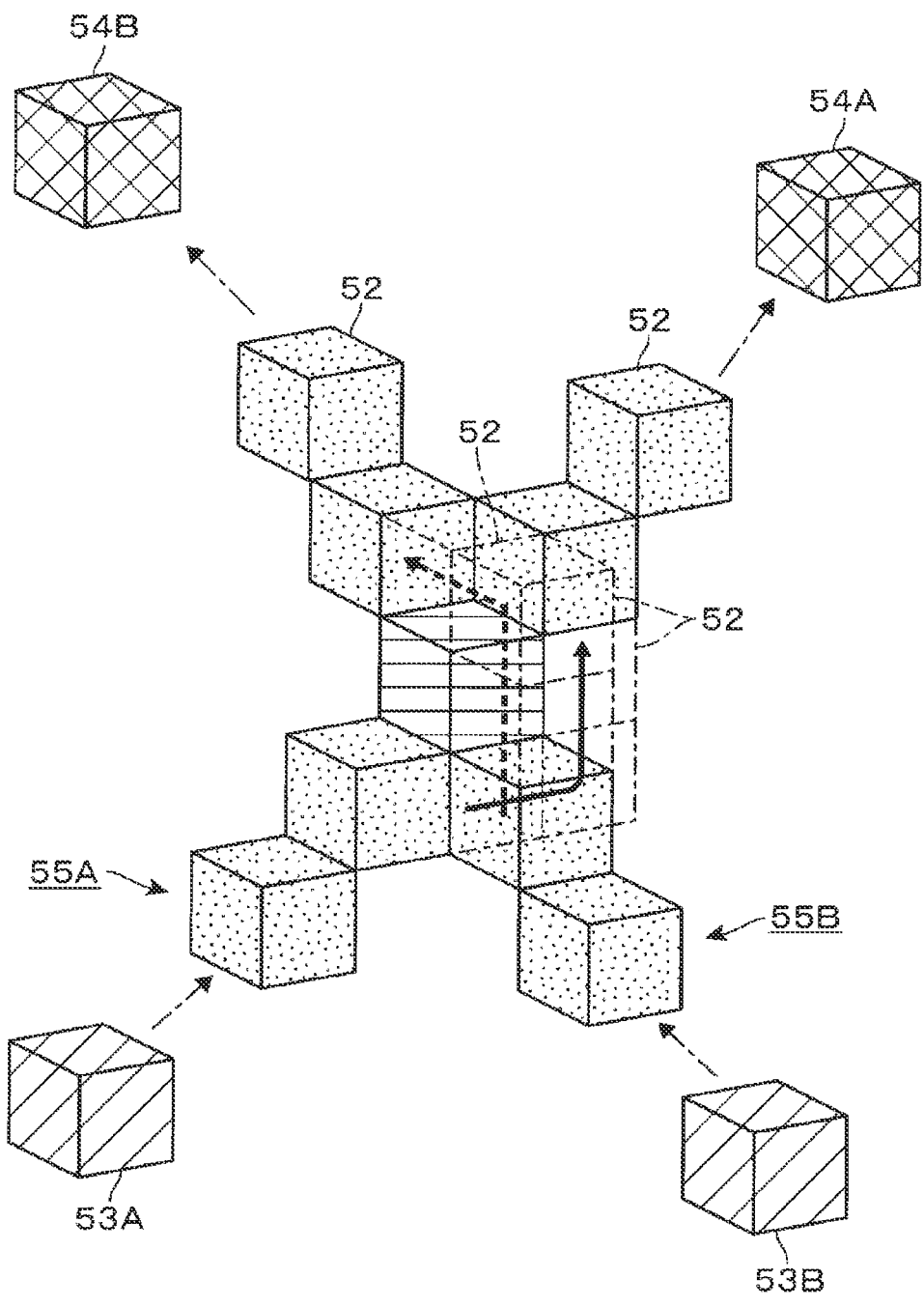
FIG. 10 is a perspective view of cubes showing an example of interference avoidance in the case where there is no difference in priorities between the transfer bodies.

FIG. 10 schematically shows the change in the moving path 55A and 55B, and the cubes 52 forming the moving paths 55 before change are indicated by dots. The path setting system 4 generates a plurality of candidates for the changed moving path 55A as described in FIG. 9, and calculates the moving time required for the transfer body 3A to move from the movement start cube 53A to the movement end cube 54A for each candidate. Similarly to the moving path 55A, a plurality of candidates for the changed moving path 55B are generated, and the moving time required for the transfer body 3B to move from the movement start cube 53B to the movement end cube 54B is calculated for each candidate.

Then, among the candidates of the plurality of changed moving paths 55A and the candidates of the plurality of changed moving paths 55B, a combination in which the interference cube 56 does not occur is extracted. If there are multiple combinations, the combination in which the sum of the moving time of the transfer body 3A and the moving time of the transfer body 3B is minimum is selected. The combination of candidates thus extracted, or the combination of candidates extracted and then further selected is determined as the changed moving paths 55A and 55B. In FIG. 10, the portions of the moving paths 55A and 55B thus determined, which have been changed from the original moving path 55 and are adjacent to the interference cube 56, are indicated by a solid arrow and a dashed arrow, respectively.

[Countermeasure by Deceleration of Transfer Body]

Next, the case where the interference between the transfer bodies 3A and 3B is avoided by decelerating the transfer body 3 will be described. If both transfer bodies 3A and 3B are decelerated, they may interfere with each other when the deceleration is released. Thus, the deceleration is performed when the transfer bodies 3A and 3B have different priorities. The transfer body 3 with the lower priority is moved to the interference cube 56 at a speed lower than the speed set when it is considered that the interference cube 56 is generated. Accordingly, the interference between the transfer bodies 3A and 3B is prevented by shifting the timings at which the transfer bodies 3A and 3B move to the interference cube 56. As described above, the transfer body 3 decelerates while passing through the bent portion of the moving path 55 and decelerates immediately before it reaches the movement end cube 54. Hereinafter, unless particularly mentioned, it is assumed that the deceleration means deceleration for avoiding the interference.

Figure 11:
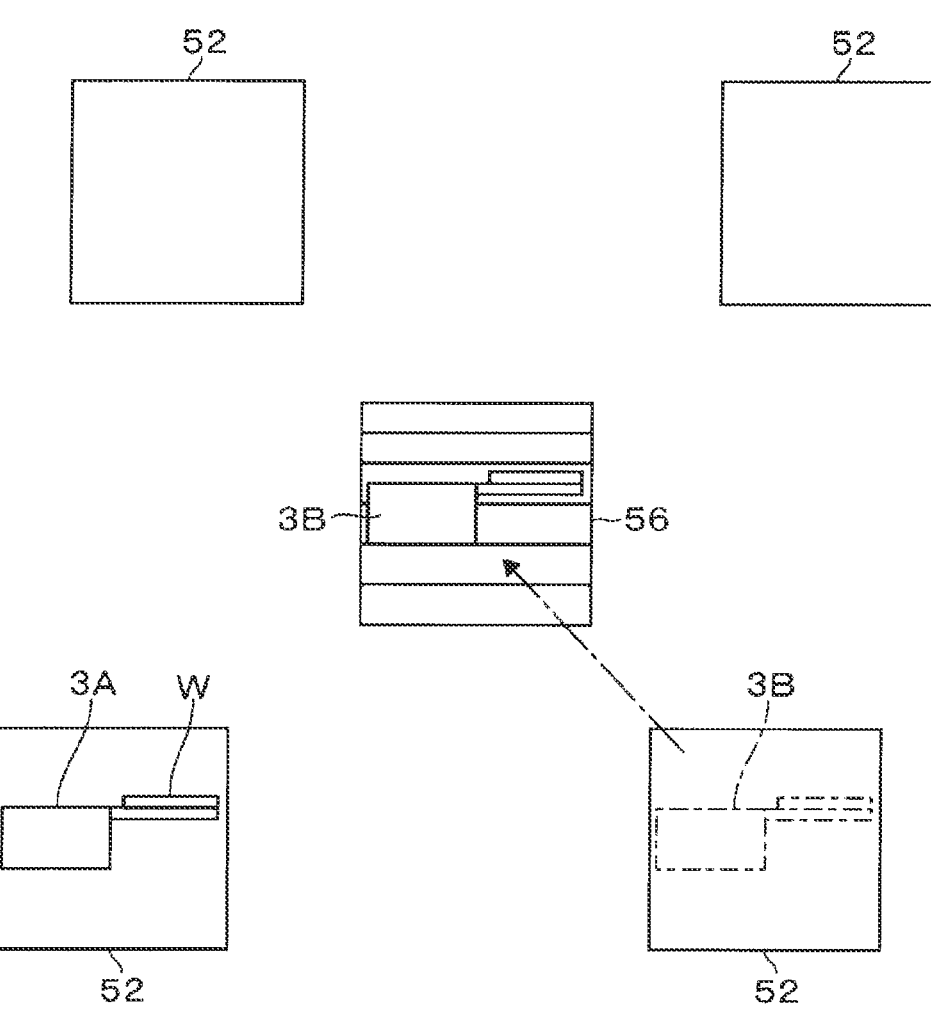
FIG. 11 schematically shows an example of interference avoidance by deceleration of the transfer bodies.
Figure 12:
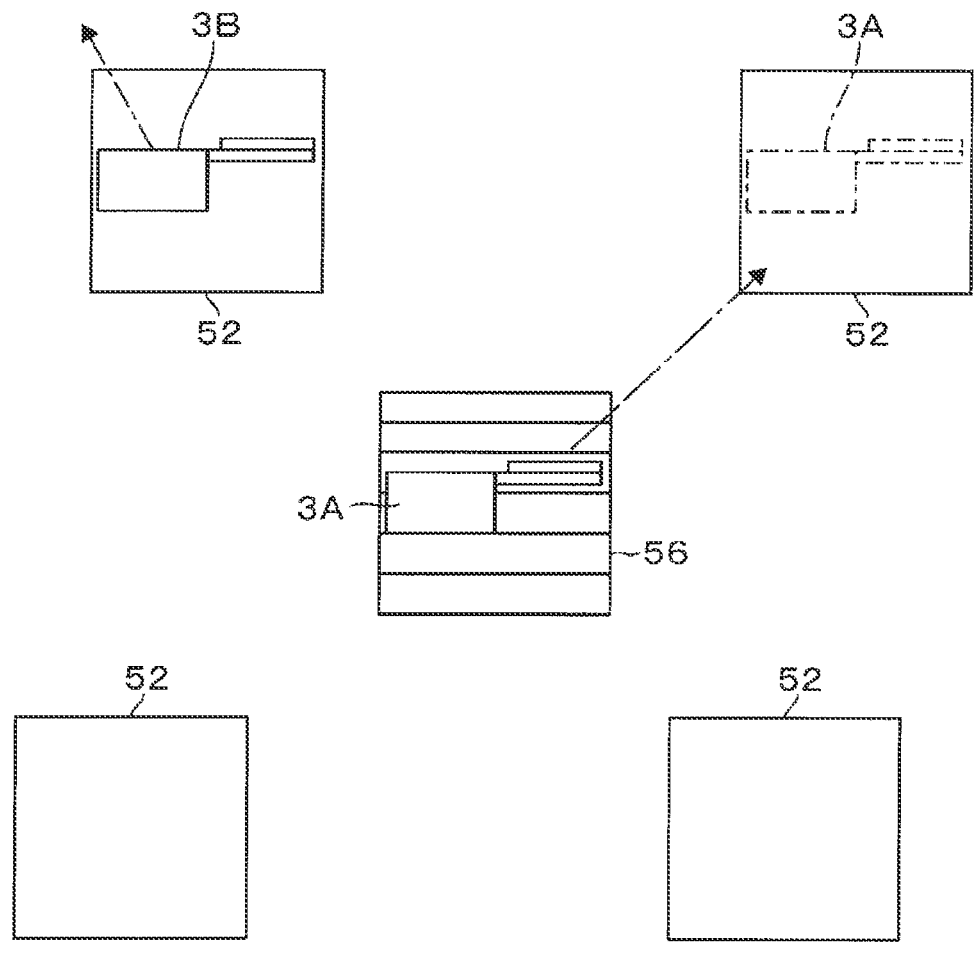
FIG. 12 schematically shows the movement of the transfer bodies after deceleration.

The case of performing deceleration will be described in detail with reference to FIGS. 11 and 12. FIGS. 11 and 12 show an example of performing deceleration for the transfer body 3A with the lower priority. The transfer body 3B moves each part of the moving path 55B at a speed determined when it is determined that the interference cube 56 is generated. The transfer body 3A decelerates with respect to the speed obtained when it is determined that the interference cube 56 is generated on the path from the movement start cube 53 to the interference cube 56. Accordingly, the transfer body 3B passes through the interference cube 56 first (see FIG. 11) and, then, the transfer body 3A passes through the interference cube 56 (see FIG. 12). Since the interference is avoided by the deceleration, the interference cube 56 shown in FIGS. 11 and 12 is not exactly the interference cube 56. However, it is still illustrated as the interference cube 56 for convenience.

The deceleration rule is predetermined such that the deceleration is started at a predetermined deceleration rate from a position spaced apart from the interference cube 56 by a predetermined distance and the deceleration is continued for a predetermined period, for example. Further, the predetermined deceleration rule includes the recovery of the speed after the completion of the deceleration. For example, after the deceleration is performed for the predetermined period as described above, the acceleration is started at a predetermined acceleration rate, and the speed is returned to the original speed when the deceleration is not performed because there is no interference cube 56.

For example, in the above-described deceleration rule, the deceleration period is set to a relatively short period. It is determined whether or not the interference can be eliminated by setting the deceleration period to a relatively short period.

When it is determined that the interference cannot be eliminated, this period is extended by a predetermined time and the determination is performed again. The extension of the period and the determination of interference are repeated, and the time period obtained when it is determined that the interference has been eliminated is determined as the deceleration period. If the deceleration period is relatively long, the speed of the transfer body 3 becomes zero during that period (i.e., the transfer body 3 is in a temporary stop state). In that case, the acceleration of the transfer body 3 is started (i.e., the transfer body 3 starts movement again) after the elapse of the deceleration period. As described above, the degree of deceleration is appropriately adjusted, and the transfer body 3 is temporarily stopped as necessary.

[Selecting and Determining Countermeasure]

When the transfer bodies 3A and 3B have different priorities as described above, it is possible to take any one countermeasure among changing the moving path 55 as shown in FIG. 9 or decelerating the transfer body 3 as shown in FIGS. 11 and 12. The path setting system 4 selects the countermeasure capable of shortening the moving time required for the transfer body 3 to move from the movement start cube 53 to the movement end cube 54. Specifically, the case where the transfer body 3A has the lower priority will be described. In this case, the moving time of the transfer body 3A from the movement start cube 53A to the movement end cube 54B along the changed moving path 55A and the moving time thereof along the original moving path 55A where it is considered that the deceleration is performed are compared. As a result of the comparison, the countermeasure capable of ensuring the shorter moving time is selected, and it is considered that the interference cube 56 has been eliminated. For example, when it is determined to change the moving path 55A, the new moving path 55A is displayed on the screen instead of the original moving path 55A. When the deceleration is performed, the purpose of deceleration is displayed on the screen.

The data that is determined by the above simulation or is set for execution of the simulation is stored in a storage constituting the path setting system 4, such as the storage medium 42 in which the software 41 is stored, or in the external storage of the path setting system 4. Specifically, the information on the parameters inputted by an operator, the positions of the movement start cube 53A and the movement end cube 54B, the determined moving paths 55A and 55B, and the speed of the transfer body 3 at each part on the moving paths 55A and 55B 3 is stored in the storage. Therefore, after the simulation is executed, the data that specifies the cube at which the transfer body 3 is located among the cubes 52 (including the movement start cube 53 and the movement end cube 54) of the movement area 5 and the timing at which the transfer body 3 is located at the corresponding cube from an arbitrary reference timing to avoid the interference between the transfer bodies 3A and 3B is stored in the storage. Therefore, such data may also specify the speed change to which the transfer body 3 is subjected from the reference timing to reach the corresponding cube along the moving path 55 from the movement start cube 53 to the movement end cube 54.

The controller 10 uses the data thus stored in the storage. The data is received by the controller 10 by connecting the storage medium containing the data to the controller 10 or by downloading it from the network. Further, the controller 10 outputs control signals based on the data to control the operations of the transfer bodies 3A and 3B, and the transfer bodies 3A and 3B operate in the same manner as in the simulation. In other words, the transfer bodies 3A and 3B move in the substrate transfer area 22 along the moving path 55 that is the same as that determined in the simulation at the speed that is the same as that determined in the simulation.

In the above-described simulation, the case where the path setting system 4 automatically determines whether to change the moving path 55 or decelerate the transfer body 3 has been described. However, it is also possible to change the setting such that an operator can determine a countermeasure, for example. When the setting is changed such that an operator can determine a countermeasure, the information that can be used by the operator to determine a countermeasure, such as the moving paths of the transfer body 3 before and after change, the time difference between the time at which the transfer body 3 reaches the movement end cube 54 in the case of changing the path and the time at which the transfer body 3 reaches the movement end cube 54 in the case of performing deceleration, or the like, is displayed on the screen. The operator can determine a countermeasure while monitoring the screen display.

[Cube Size]

Figure 13:
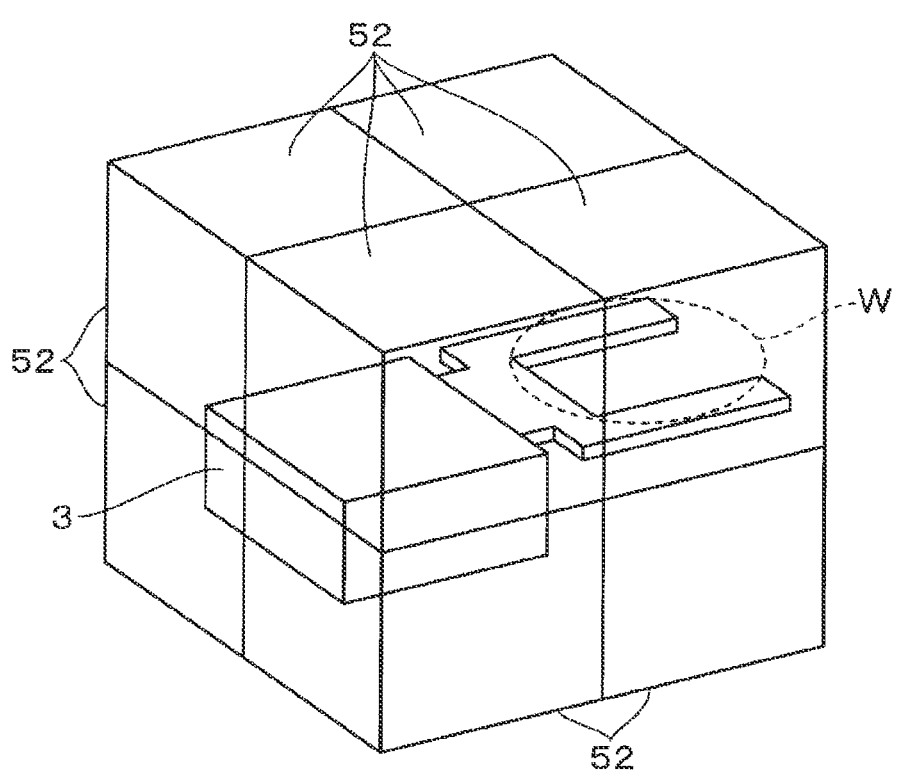
FIG. 13 is a perspective view showing another correspondence example between the cube and the transfer body.

In order to avoid complicated illustration and description, the case where one cube 52 has a size capable of containing the transfer body 3 supporting the wafer W has been described. However, the cube 52 may have any size. FIG. 13 shows a case where one cube 52 is smaller than the transfer body 3 and the transfer body 3 supporting the wafer W is contained in eight cubes 52.

The number of the cubes 52 to be specified as the movement start cube 53 and the movement end cube 54 and the number of cubes considered as the interference cubes 56 change depending on the setting of the size of the cube 52. In other words, a plurality of cubes 52 may form a group of cubes to form each of the movement start cube 53, the movement end cube 54, and the interference cube 56. In addition, the number of cubes 52 arranged in a vertical direction and the number of cubes 52 arranged in a horizontal direction on the moving path 55 also change depending on the setting of the size of the cube 52.

As described above, in the above simulation, an operator sets the size parameters of the cube 52. Further, the transfer body 3 is specified as cubes that contain the transfer body 3 in the simulation and the parameters include a parameter that specifies the number of cubes 52 containing the transfer body 3. The size parameters of the cube 52 are also stored in the storage similarly to other parameters.

[Software Configuration of Path Setting System 4]

Referring back to FIG. 3, the configuration example of the software 41 of the path setting system 4 will be described. The software 41 is configured to perform the above-described processes, and can be roughly divided into a logic part 6A, a graphical user interface (GUI) part 6B, and a database (DB) part 6C.

The logic part 6A includes a path generation engine 61 and an interference check engine 62. The path generation engine 61 sets the virtual substrate transfer area 51 and automatically generates the moving path 55. The interference check engine 62 checks whether or not there is interference between the transfer bodies 3 on the generated moving path 55. In other words, whether the interference cube 56 exists or not is determined.

The GUI part 6B includes a path setting/display part 63 and a parameter setting part 64. The path setting/display part 63 displays the cubes 52 forming the substrate transfer area 51, the movement start cube 53, the movement end cube 54, the moving path 55, and the interference cube 56 on the screen. The parameter setting part 64 displays a screen for allowing an operator to set the above-described parameters.

Specifically, for example, a parameter input window is displayed to allow an operator to input parameters from the input part 44.

The DB part 6C includes a parameter database 65 and a path database 66. The parameter database 65 stores the above-described various parameters inputted and set by an operator. The path database 66 stores data related to the substrate transfer area 51 or data determined from various parameters. The data related to the substrate transfer area 51 other than the parameters stored in parameter database 65, such as the positions of the specified movement start cube 53 and the specified movement end cube 54, the determined moving path 55, and the speed of the transfer body 3 at each part on the moving path 55, are stored. The data forming the DB part 6C is used for controlling the transfer bodies 3A and 3B under the control of the controller 10.

The software 41 and the CPU 47 that executes various calculations correspond to a time information acquisition part, a virtual area setting part, a path generation part, an interference determination part, and a countermeasure part. Further, the storage that stores various parameters corresponds to a support information storage part and a priority storage part.

[Moving Path Setting Sequence]

Next, an example of the sequence of simulation performed by the path setting system 4 will be described with reference to the flowchart of FIG. 14. First, an operator sets the substrate transfer area 51 by inputting parameters related to size and shape (step S1). Then, the operator inputs size parameters of the cube 52 and sets the size of the cube 52 (step S2).

Then, the operator specifies the positions of the movement start cube 53 and the movement end cube 54 for the transfer body 3A (step S3), and sets the parameters for the transfer body 3A (step S4). The parameters include the maximum speed (maximum speed before support) on the moving path 55A, the time period required to reach the maximum speed from the start of movement (time period required to reach the maximum speed before support), the time period required until the transfer body 3A starts movement from the reference timing, and the wafer support information on the moving path 55A to be generated. The moving path 55A is generated by the path setting system 4 based on these parameters, and displayed on the screen (step S5).

Next, the operator specifies the positions of the movement start cube 53 and the movement end cube 54 for the transfer body 3B (step S6), and sets the parameters for the transfer body 3B (step S7). The parameters include the maximum speed (maximum speed before support) on the moving path 55B, the time period required to reach the maximum speed from the start of movement (time period required to reach the maximum speed before support), the time period required until the transfer body 3B starts movement from the reference timing, and the wafer support information on the moving path 55B to be generated. The path setting system 4 generates the moving path 55B based on these parameters, and displays it on the screen (step S8).

The time information of the positions of the transfer bodies 3A and 3B is acquired, and it is determined that whether or not the transfer bodies 3A and 3B are located in the same cube among the cubes 52 forming the moving paths 55A and 55B (i.e., whether or not there is the interference cube 56) (step S9). When it is determined in step S9 that there is no interference cube 56, the transfer bodies 3A and 3B are determined to move along the moving paths 55A and 55B obtained at the time of determination, respectively, at the speed obtained at the time of determination at each part of the moving paths 55A and 55B.

When it is determined in step S9 that the interference cube 56 is generated, a window requesting the input of priority indicating the order of movement of the transfer bodies 3A and 3B in the interference cube 56 and the moving paths 55A and 55B including the interference cube 56 is displayed on the screen (step S10).

When there is a difference in the inputted priorities, the path setting system 4 changes the operation setting of the transfer body 3 with the lower priority as described above (step S11). In other words, the moving path 55 of the transfer body 3 with the lower priority is changed as shown in FIG. 9, or the transfer body 3 with the lower priority decelerates on the moving path 55 as shown in FIGS. 11 and 12. When there is no difference in the priorities, the path setting system 4 changes the operation setting of each transfer body 3. Specifically, as shown in FIG. 10, the moving path of each transfer body 3 is changed (step S12). After the operation setting of one or both of the transfer bodies 3A and 3B is changed in steps S11 and S12, it is determined whether or not the interference cube 56 is generated by changing the operation setting (i.e., whether or not the interference cube 56 has been eliminated) (step S13).

When it is determined in step S13 that the interference cube 56 is generated, a message is displayed, for example, and a window that requests the input of the priority is displayed so that the priority can be reset. In other words, steps subsequent to step S10 can be executed again. When it is determined in step S13 that the interference cube 56 is not generated, it is determined that the transfer bodies 3A and 3B move along the moving paths 55A and 55B at the time of determination, respectively, at the speed at the time of determination at each part of the moving paths 55A and 55B.

[Summary of Effects of Path Setting System 4]

In accordance with the above-described path setting system 4, by setting the movement start position (the movement start cube 53) and the movement end position (the movement end cube 54) in the virtual substrate transfer area 51, the moving path 55 of each transfer body 3 is automatically generated as a column of the cubes 52. Further, whether or not the transfer bodies 3A and 3B interfere with each other is determined based on the time information of the position of the transfer body 3 for each of the cubes 52 forming the moving path 55. The result of determination is expressed as the existence or non-existence of the interference cube 56. Therefore, an operator can easily recognize whether or not the transfer bodies 3 interfere with each other. In addition, when it is determined that the interference has occurred, the path setting system 4 automatically determines the countermeasure or the countermeasures are suggested so that an operator can select one on the screen. Accordingly, the operator can easily set the moving path 55.

Since whether or not the transfer bodies 3A and 3B interfere with each other is determined in the above-described manner, even if the moving paths 55A and 55B overlap, it is determined that there is no inference when the timings at which the transfer bodies 3A and 3B are located at the cube 52 where the moving paths 55A and 55b overlap are shifted. Therefore, various unnecessary countermeasures such as the change of the moving path 55 or the deceleration of the transfer body 3 are not required. Accordingly, the decrease in the transfer efficiency of the wafer W in the substrate processing apparatus 1 is prevented.

The path setting system 4 can obtain the correspondence between the elapsed time from an arbitrary reference timing and the cube 52 where each transfer body 3 is located, as described above. One transfer body 3 may be shifted from the cube 52 where the other transfer body 3 is located. In other words, the cube 52 where the other transfer body 3 can be located in the substrate transfer area 51 can be detected by obtaining the above correspondence. By detecting the cube 52, a plurality of movement patterns of the other transfer body 3 that can avoid interference can be acquired. Therefore, it is possible to appropriately determine one of the countermeasures, such as the change of the moving path and the deceleration, so that the interference can be avoided and the delay of the arrival of the transfer body 3 at the movement end cube 54 can be suppressed. Further, by appropriately selecting one of the candidates for changing the path and appropriately adjusting a degree of deceleration, further delay of the arrival of the transfer body 3 at the movement end cube 54 is more reliably suppressed. As described above, in the path setting system 4, by obtaining the correspondence between the elapsed time from an arbitrary reference timing and the cube 52 where each transfer body 3 is located, the moving path 55 and the speed of the transfer body 3 on the moving path 55 can be set such that the decrease in the transfer efficiency of the wafer W by each transfer body 3 can be prevented. The cube 52 where the transfer body 3 is located at an arbitrary timing is determined based on the wafer support information. Therefore, the wafer W can be stably supported, and the decrease in the transfer efficiency of the wafer W can be prevented.

Since it is possible to detect whether or not the transfer body 3 is located at the cube 52 at an arbitrary timing and obtain a plurality of movement patterns of the transfer body 3 that can avoid interference, an operator can effectively select the countermeasure. Specifically, as described above, the time at which the transfer body 3 arrives at the movement end cube 54 is displayed on the screen for every countermeasure, so that the information used for an operator to select a countermeasure can be provided, and the operator can easily set the path.

[Further Description of Sequence and Countermeasure]

The step order in the above sequence may be appropriately changed as long as it does not hinder the generation of the moving path and the determination of interference. For example, the priority may be set at the time of setting parameters such as the maximum speed for the transfer bodies 3A and 3B.

Further, in the wafer support information on the moving path 55 where the transfer body 3 supports the wafer W, the speed that is automatically reduced from the maximum speed (the maximum speed before support) set by an operator based on a predetermined rule is set as the maximum speed (the maximum speed during support). The maximum speed during support is not necessarily automatically determined, and may be set by the operator at the time of setting parameters such as the maximum speed for the transfer bodies 3A and 3B and the like. When the operator sets the maximum speed during support, the upper limit of the maximum speed during support that can be set may be lower than the upper limit of the maximum speed before support that can be set. In other words, the upper limit of the maximum speed that can be set by the operator may be changed depending on the wafer support information that is a parameter indicating whether or not the transfer body 3 supports the wafer W.

The above-described countermeasures are merely examples, and other countermeasures may be considered. For example, although the case where both of the moving paths 55A and 55B are changed when the priorities are the same has been described, only one of the moving paths 55A and 55B may be changed. More specifically, the moving paths 55A and 55B to be changed is determined based on the sum of the time periods required for the transfer bodies 3A and 3B to reach the movement end cubes 54A and 55B, respectively. If the sum of the time periods required for changing only one moving path 55 is smaller than the sum of the time periods required for changing both moving paths 55, only one moving path 55 may be changed. When the priorities are the same, it is unnecessary to decelerate both transfer bodies 3A and 3B, and the timings at which the transfer bodies 3A and 3B reach the interference cube 56 may be shifted by changing the degree of deceleration between the transfer bodies 3A and 3B. In other words, it is possible to decelerate both transfer bodies 3A and 3B. Although the embodiment of the change of the moving path or the deceleration as the countermeasure described herein is an extremely simple example in order to describe the outline and effect of the path setting system 4, the embodiment can be set to any other embodiments.

[Avoiding Interference by Tilting Transfer Body]

Figure 15:
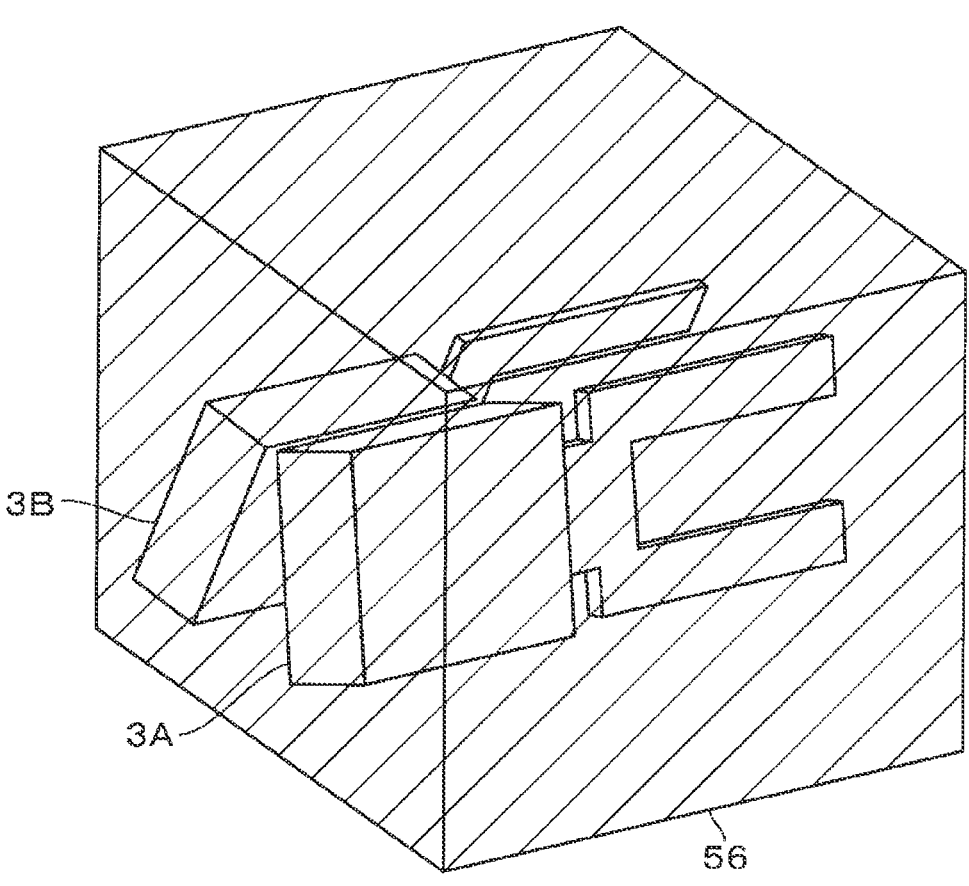
FIG. 15 is a perspective view of the transfer body that avoids interference by tilting.

The interference is avoided not only by the change of the moving path 55 or the deceleration on the moving path 55, but by other operations. As described above, the transfer body 3 can be tilted. More specifically, the surface of the support 22 of the transfer body 3 that supports the wafer W is horizontal, but the posture of the transfer body 3 may be changed such that the supporting surface is tilted with respect to the horizontal plane. By tilting each transfer body 3, it is possible to reduce the planar area occupied by each of the transfer bodies 3A and 3B in the interference cube 56 as shown in FIG. 15. Accordingly, the interference at the corresponding interference cube 56 can be avoided.

Each transfer body 3 is tilted to prevent the wafer W from falling from the transfer bodies 3A and 3B when both the transfer bodies 3A and 3B are not supporting the wafer W on the moving paths 55A and 55B where the interference cube 56 is generated. Therefore, whether to tilt or not to tilt the transfer bodies 3A and 3B is determined based on the wafer support information.

In the case of tilting both the transfer bodies 3A and 3B, the transfer bodies 3A and 3B can quickly reach the movement end cube 54 compared to the case of changing the moving path 55 or performing deceleration. Therefore, when it is possible to tilt the transfer bodies 3A and 3B, the tilting of the transfer bodies 3A and 3B may be automatically determined. However, an operator may select and determine the countermeasure among the tilting of the transfer body 3, the change of the moving path, and the deceleration. When the tilting is determined, the information on the determination is stored in the path database 66, for example, and the operation of the transfer body 3 in the substrate processing apparatus 1 is controlled as determined.

[Expansion of Interference Avoidance Area]

It is preferable that not both transfer bodies 3 are located at a certain cube 52 at the same time, and one transfer body 3 may be located at the cube 52 adjacent to the cube 52 where the other transfer body 3 is located. However, the operation of each transfer body 3 can be set such that one transfer body 3 cannot be located at the cube 52 adjacent to the cube 52 where the other transfer body 3 is located.

Figure 16:
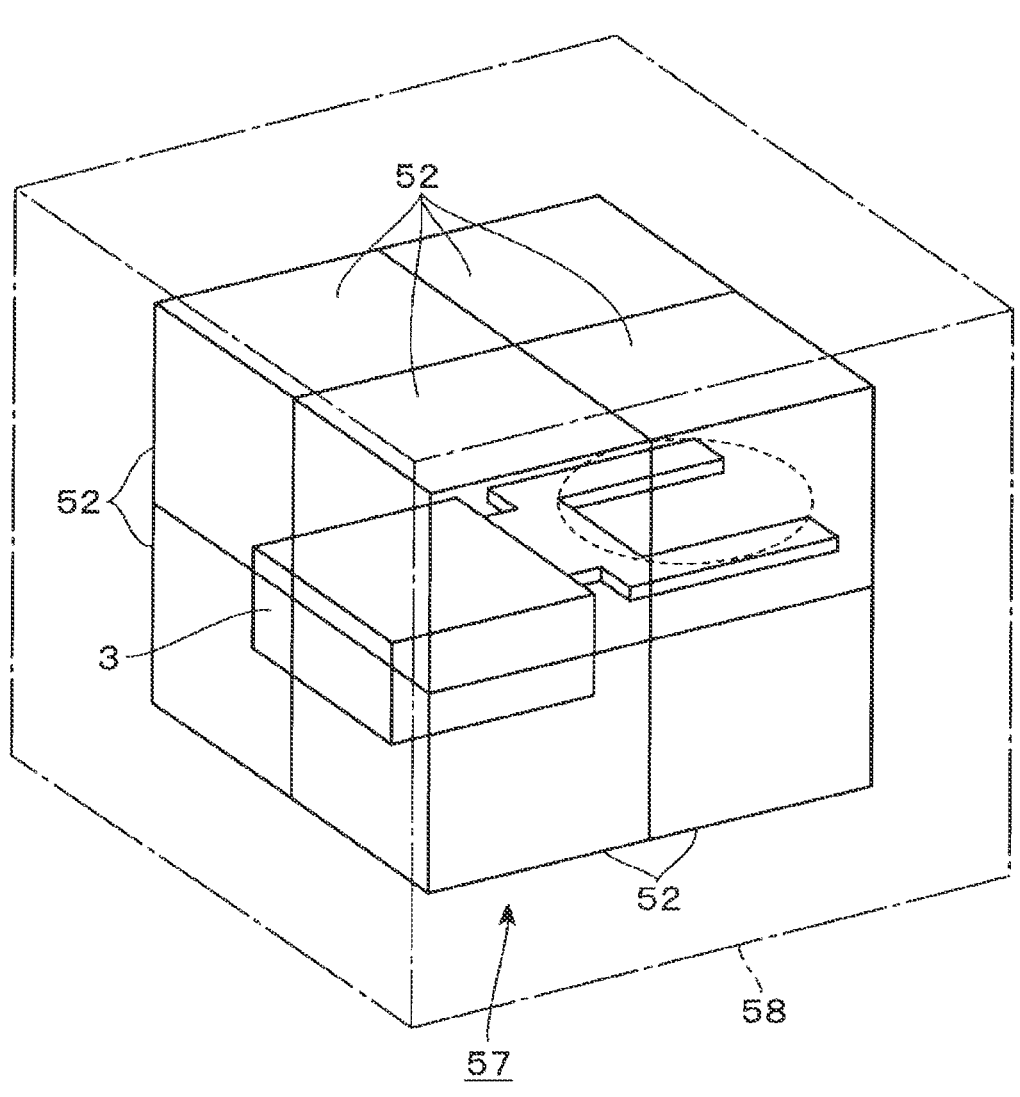
FIG. 16 is a perspective view showing an exclusive cube.

This will be described in detail with reference to FIG. 16. The transfer body 3 moving along the moving path 55 is represented as a moving cube 57. The moving cube 57 may be formed of one cube 52 or an aggregate of a plurality of cubes 52. As described above, the size of the cube 52 may be set arbitrarily, and the number of cubes 52 having a size that is enough to contain the transfer body 3 is specified by the parameter. The moving cube 57 is formed of cubes 52 whose number is specified by the parameter. Therefore, the moving cube 57 has a size corresponding to the size of the transfer body 3 and contains the transfer body 3. In FIG. 16, the moving cube 57 is formed of eight cubes 52. An exclusive cube 58 is set to contain the moving cube 57, and the center of the moving cube 57 and the center of the exclusive cube 58 coincide with each other. In the simulation, the exclusive cube 58 that is an exclusive rectangular parallelepiped moves by the movement of the transfer body 3 (i.e., by the movement of the moving cube 57).

When the exclusive cube 58 is set, whether or not there is interference between the transfer bodies 3A and 3B is determined by determining whether or not one transfer body 3 is located at the cube 52 overlapping the exclusive cube 58 of the other transfer body 3. When it is determined that one transfer body 3 is not located at the corresponding cube 52, it is considered that there is no interference, and the moving path 55 of each transfer body 3 and the speed on the moving path 55 are determined. When it is determined that one transfer body 3 is located at the corresponding cube 52, it is considered that there is a risk of interference between the transfer bodies 3, and the cube 52 where one transfer body is located is considered as the interference cube 56 among the cubes 52 overlapping the exclusive cube 58.

Even if both the transfer bodies 3A and 3B are not located at the same cube 52, if the cube 52 where the transfer body 3A is located and the cube 52 where the transfer body 3B is located are close to each other, the cubes 52 may become the interference cubes 56. In other words, due to the presence of the exclusive cube 58, the area that can serve as the interference cube 56 is expanded. When the exclusive cube 58 is set, if the interference cube 56 is generated, the change of the moving path 55, the deceleration, or the tilting of each transfer body 3, which are the above-described countermeasure, can be performed, similarly to when the exclusive cube 58 is not provided. By setting the exclusive cube 58, the interference between the transfer bodies 3 can be more reliably prevented. The size of the exclusive cube 58 can be arbitrarily set by an operator, for example, and the parameters related to the exclusive cube 58, such as the size and the like, are also stored in the parameter database 65, for example.

[Incorporation of Software into Controller of Substrate Processing Apparatus]

Although the case where the software 41 is incorporated into a computer separate from the controller 10 of the substrate processing apparatus 1 has been described, the software 41 may be incorporated into the controller 10. Therefore, the controller 10 may be configured as the path setting system. Further, the case where the moving path 55 is set to avoid interference between the transfer bodies 3 before the operation of the substrate processing apparatus 1 has been described. When the software 41 is incorporated into the controller 10, the setting can be performed during the operation of the substrate processing apparatus 1 as well as before the operation, and the operation of the transfer body 3 can be controlled based on the setting.

Hereinafter, a specific example thereof will be described. During the operation of the substrate processing apparatus 1, the controller 10 issues a movement instruction to move the transfer body 3A move from an arbitrary position to a position in front of one module so that the transfer body 3A can transfer the wafer W to the corresponding one module. Then, the controller 10 issues a movement instruction to move the transfer body 3B from an arbitrary position to a position in front of another module so that the transfer body 3B can transfer the wafer W to another module. The setting of each moving path 55 in this case will be described.

First, when the movement instruction is issued to the transfer body 3A, the position of the transfer body 3A at the time of issuing the movement instruction is considered as the movement start cube 53A, and the position in front of one module is considered as the movement end cube 54A. In this manner, the moving path 55A is generated, and the transfer body 3A moves along the moving path 55. When the movement instruction is issued to the transfer body 3B, the position of the transfer body 3B at the time of issuing the movement instruction is considered as the movement start cube 53B, and the position in front of another module is considered as the movement end cube 54B. In this manner, the moving path 55B is generated. Then, whether or not the interference cube 56 is generated is determined using various parameters, similarly to the case of determining whether or not the interference cube 56 is generated before the operation of the substrate processing apparatus 1.

In the case of determining whether or not the interference cube 56 is generated before the operation of the substrate processing apparatus 1, the timings at which the transfer bodies 3A and 3B start movement from an arbitrary reference timing are inputted as parameters and used for a time difference between timings at which the transfer bodies 3A and 3B start movement from the movement start cube 53. In the case of determining whether or not the interference cube 56 is generated during the operation of the substrate processing apparatus 1, whether or not the interference cube 56 is generated is determined using the time difference between the timing at which the movement instruction for the transfer body 3A is issued and the timing at which the movement instruction for the transfer body 3B is issued as the time difference between the timings at which the transfer bodies 3A and 3B start movement from the movement start cube 53.

When it is determined that the interference cube 56 is generated, in order to avoid interference between the transfer bodies 3A and 3B, the transfer body 3A starts movement after the setting for changing the moving path 55A or decelerating the transfer body 3A is completed. Therefore, in this example, immediately after the setting for generating the path of one transfer body 3 and avoiding interference between the transfer bodies 3 is completed by the simulation, the operation is controlled based on the setting. Various calculations and determinations are quickly performed by the controller 10, and the transfer bodies 3A and 3B start movement substantially at the same timing as the timing at which the movement instruction is issued.

The controller 10 into which the software 41 is incorporated can move the transfer bodies 3A and 3B without interference between the transfer bodies 3A and 3B while preventing excessive delay in arrival of the transfer body 3A at the position (the movement end cube 54A) in front of the module. As clearly can be seen from the above example, when the moving path 55 is set, it is unnecessary for an operator to set the movement start cube 53 and the movement end cube 54.

[Supplementary Description]

Even if the generated moving paths 55A and 55B overlap, the moving paths 55A and 55B are not changed as long as there is no interference between the transfer bodies 3A and 3B. However, in order to more reliably prevent interference between the transfer bodies 3A and 3B, the cube 52 where the overlapping occurs is considered as the interference cube 52, and the moving path 55A and/or the moving path 55B may be changed.

Further, it is determined whether or not the trajectory of the exclusive cube 58 set for one transfer body 3 overlaps the trajectory of the exclusive cube 58 set for the other transfer body 3. When they overlap, the cube 52 where the overlapping occurs is considered as the interference cube 56, and the moving path 55A and/or the moving path 55B may be changed. In other words, when the trajectories overlap even if one transfer body 3 is not located at the cube 52 that overlaps the exclusive cube 58 set for the other transfer body 3 as illustrated in FIG. 16, it is estimated that the interference has occurred and the countermeasure may be selected. The determination of interference between the moving paths 55 is not limited to the determination of interference between the transfer bodies 3, and may be determination of overlapping between the moving paths 55, or determination of overlapping between one moving path 55 and its peripheral area and the other moving path 55.

Since the interference between the moving paths 55 is determined and the result is displayed on the screen, an operator's effort for the determining process can be omitted and, thus, an operator's burden is reduced. Therefore, although the case where the countermeasure is automatically determined or an operator suggests the countermeasure based on the interference determination result has been described, the countermeasure may not be determined or suggested.

Although the case where the substrate transfer area 51 is divided into a large number of cubes 52 has been described, it may be divided into rectangular parallelepipeds instead of cubes. Further, although the case where each of the movement start position of the transfer body 3, the movement end position of the transfer body 3, and the position where interference between the transfer bodies 3 occurs is represented by one cube 52 or an aggregate of a plurality of cubes has been described, each of them may be represented by a rectangular parallelepiped instead of a cube.

The number of the transfer bodies 3 is not limited to two, and three or more transfer bodies may be provided. Even when three or more transfer bodies 3 are provided, the interference between the transfer bodies 3 can be prevented in the same manner. For example, when a transfer body 3C is provided in addition to the transfer bodies 3A and 3B, whether or not the interference cube 56 is generated between the transfer body 3A and transfer body 3B is determined, and the above-described countermeasure is selected to determine the moving path and the speed. Then, whether or not the interference cube 56 is generated between the transfer body 3A and the transfer body 3C is determined while moving them along the determined moving path at the determined speed. When it is determined that the interference cube 56 is generated, the above-described countermeasure is selected to further change the determined moving path and the determined speed.

Figure 17:
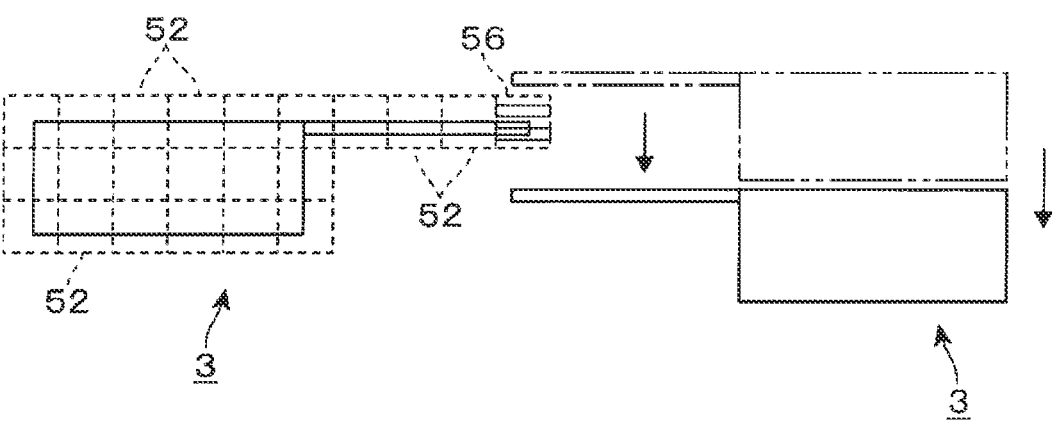
FIG. 17 schematically shows an example of occurrence of an interference cube.

For supplementary description of the interference cube 56, the size of the cube 52 may be set arbitrarily. Thus, as shown in FIG. 13, the size of one cube 52 may be set such that one transfer body 3 is contained in a plurality of cubes 52. In other words, only a part of one transfer body 3 exists in one cube 52, and the transfer body 3 may be represented by an aggregate of the cubes 52. When the transfer body 3 is represented by an aggregate of the cubes 52, the transfer body 3 is represented by a cube consisting of eight cubes 52 in FIG. 13. The transfer body 3, however, may have an arbitrary shape corresponding to the shape of the transfer body 3 instead of a cube, as shown in FIG. 17. When the transfer body 3 is represented by an aggregate of the cubes 52, only a part of the transfer body 3 exists in one of the cubes 52. When another transfer body 3 enters the cube 52 where a part of the transfer body 3 exists, the corresponding cube 52 becomes the interference cube 56. For example, it is set such that the transfer body 3 is represented by an aggregate of the cubes 52 shown in FIG. 17. When the aggregate of the cubes 52 moves along the moving path 55, if another transfer body 3 enters one of the cubes 52 as shown in FIG. 17, the corresponding one cube 52 becomes the interference cube 56, and the countermeasure is selected to avoid the interference.

The movement start cube 53 and the movement end cube 54 of the transfer body 3 are not necessarily selected from arbitrary positions in the horizontal direction and the vertical direction in the substrate transfer area 51, and may be selected from the positions only in the horizontal direction. In other words, when the moving path 55 is generated, the vertical position of the moving path 55 may be fixed.

The present disclosure is not necessarily applied to the case of transferring a substrate in a vacuum atmosphere, and may also be applied to the case of transferring a substrate in an atmospheric atmosphere. The substrate transfer area 22 may have any shape, and does not necessarily have the above-described rectangular parallelepiped shape. The shape of the virtual substrate transfer area 51 may be set to correspond to the shape of the substrate transfer area 22, and thus is not limited the above-described rectangular parallelepiped shape.

For example, a structure such as a column through which the transfer body 3 cannot penetrate may be provided in the substrate transfer area 22. In this case, when the size of the virtual substrate transfer area 51 and the size of the cube 52 are in steps S1 and S2, for example, the cube 52 located at the position of the structure in the substrate transfer area 51 is set as a structure cube. The transfer body 3 cannot penetrate through the structure cube when the moving path 55 is generated or changed later. Therefore, the moving path 55 is generated by specifying the movement start cube 53 and the movement end cube 54 such that the moving distance becomes minimum. However, when the structure cube is set, the moving path 55 is generated such that the shortest distance is obtained after the structure cube is avoided. The structure cube is displayed on the screen in a color different from that of other cubes, for example.

It should be noted that the embodiments of the present disclosure are illustrative in all respects and are not restrictive. The above-described embodiments may be omitted, replaced, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A path setting system used for setting paths of a plurality of transfer bodies in a substrate transfer device, the substrate transfer device including a substrate transfer area and the plurality of transfer bodies, each having a support configured to support a substrate and configured to float and move by a magnetic force from a floor forming the substrate transfer area, comprising:

an input receiver configured to receive information for generating a moving path;

a virtual area setting part configured to set a virtual area corresponding to the substrate transfer area;

a display configured to display the virtual area;

a path generating part configured to generate the moving path of each of the transfer bodies from a movement start position to a movement end position based on the received information; and an interference determining part configured to determine interference between the transfer bodies based on the respective moving paths, wherein the display displays the moving path of each of the transfer bodies on the virtual area and displays interference position on the virtual area when the interference is determined to occur, the virtual area is set as a group of rectangular parallelepipeds obtained by dividing the substrate transfer area in a forward-backward direction, a left-right direction, and a vertical direction, and the path generating part sets one rectangular parallelepiped and another rectangular parallelepiped in the virtual area as the movement start position and the movement end position, respectively, and sets the moving path from the movement start position to the movement end portion as a column of the rectangular parallelepipeds.

2. The path setting system of claim 1, further comprising:

a time information acquiring part configured to acquire time information of different positions of the transfer bodies on the moving paths, wherein the interference determining part determines interference between the transfer bodies based on the time information.

3. The path setting system of claim 2, further comprising:

a support information storing part configured to store support information indicating whether or not the substrate is supported by the transfer bodies on the moving paths, wherein the interference determining part determines the interference between the transfer bodies based on the support information.

4. The path setting system of claim 3, further comprising:

a countermeasure part configured to avoid the interference between the transfer bodies depending on a determination result of the interference determining part.

5. The path setting system of claim 4, wherein the countermeasure part sets or suggests any one of the following countermeasures:

changing at least one of the moving paths to avoid an interference occurrence position where the interference between the transfer bodies is expected to occur;

shifting timings at which the transfer bodies move to the interference occurrence position; and tilting each of the transfer bodies at the interference occurrence position.

6. The path setting system of claim 4, further comprising:

a priority storing part configured to store priorities of movement of the transfer bodies, wherein the countermeasure part sets or suggests, based on the priorities, any one of the following countermeasures:

changing the moving paths to avoid an interference occurrence position where the interference between the transfer bodies is expected to occur; and shifting timings at which the transfer bodies move to the interference occurrence position.

7. The path setting system of claim 6, wherein the countermeasure part changes at least one of the moving paths when the priorities of the transfer bodies are the same, and said at least one of the moving paths is changed based on the sum of moving times of the transfer bodies that are expected to interfere with each other from a movement start position to a movement end position.

8. The path setting system of claim 1, further comprising:

a time information acquiring part configured to acquire time information of positions of the transfer bodies in rectangular parallelepipeds forming the moving path; and a countermeasure part configured to avoid interference between the transfer bodies depending on a determination result of the interference determining part, wherein the interference determining part detects an interference rectangular parallelepiped where the interference between the transfer bodies is expected to determine whether or not there is interference between the moving paths based on the time information, and sets or suggests any one of the following countermeasures:

changing at least one of the moving paths to avoid the interference rectangular parallelepiped;

shifting timings at which the transfer bodies move to the interference rectangular parallelepiped; and tilting each of the transfer bodies at the interference rectangular parallelepiped.

9. The path setting system of claim 8, wherein the countermeasure part sets, as the interference rectangular parallelepiped, a rectangular parallelepiped where the other transfer body is considered to be located among the rectangular parallelepipeds overlapping an exclusive rectangular parallelepiped greater than one transfer body moving along the moving path.

10. A path setting method used for setting paths of a plurality of transfer bodies in a substrate transfer device, the substrate transfer device including a substrate transfer area and the plurality of transfer bodies, each having a support configured to support a substrate and configured to float and move by a magnetic force from a floor forming the substrate transfer area, comprising:

receiving information for generating a moving path;

setting a virtual area corresponding to the substrate transfer area as a group of rectangular parallelepipeds obtained by dividing the substrate transfer area in a forward-backward direction, a left-right direction, and a vertical direction by a virtual area setting part;

displaying the virtual area;

setting the moving path of each of the transfer bodies as a column of the rectangular parallelepipeds from one rectangular parallelepiped as a movement start position to another rectangular parallelepiped as a movement end position in the virtual area by a path generating part based on the received information;

determining interference between the transfer bodies based on the respective moving paths; and displaying the moving path of each of the transfer bodies on the virtual area, and displaying interference position on the virtual area when the interference is determined to occur.

11. A software having a group of steps for executing:

receiving information for generating a moving path;

setting a virtual area corresponding to a substrate transfer area as a group of rectangular parallelepipeds obtained by dividing the substrate transfer area in a forward-backward direction, a left-right direction, and a vertical direction;

displaying the virtual area;

setting the moving path of each of a plurality of transfer bodies as a column of the rectangular parallelepipeds from one rectangular parallelepiped as a movement start position to another rectangular parallelepiped as a movement end position in a virtual area corresponding to the substrate transfer area in a substrate transfer device based on the received information, the substrate transfer device including the substrate transfer area and the plurality of transfer bodies, each having a support configured to support a substrate and configured to float and move by a magnetic force from a floor forming the substrate transfer area;

determining interference between the transfer bodies based on the respective moving paths; and displaying the moving path of each of the transfer bodies on the virtual area, and displaying interference position on the virtual area when the interference is determined to occur.

* * * * *